(12) United States Patent
Garrison et al.

(10) Patent No.: US 7,073,154 B1
(45) Date of Patent: Jul. 4, 2006

(54) APPARATUS AND METHODS FOR INTERCONNECT ZONES AND ASSOCIATED CELLS IN INTEGRATED CIRCUITS

(75) Inventors: Dean Garrison, San Jose, CA (US); Mark Belshaw, Campbell, CA (US)

(73) Assignee: Altera Corporation, San Jose, CA (US)

( * ) Notice: Subject to any disclaimer, the term of this patent is extended or adjusted under 35 U.S.C. 154(b) by 94 days.

(21) Appl. No.: 10/153,172

(22) Filed: May 21, 2002

(51) Int. Cl.
*G06F 17/50* (2006.01)

(52) U.S. Cl. .............................. 716/14; 716/13; 716/8

(58) Field of Classification Search ................. 716/14, 716/12, 1, 8, 16, 13
See application file for complete search history.

(56) References Cited

U.S. PATENT DOCUMENTS

| | | | | |
|---|---|---|---|---|
| 5,161,114 A * | 11/1992 | Akiyama | ..................... | 716/21 |
| 5,410,107 A * | 4/1995 | Schaper | ...................... | 174/255 |
| 5,784,292 A * | 7/1998 | Kumar | ......................... | 716/19 |
| 5,896,300 A * | 4/1999 | Raghavan et al. | ............ | 716/10 |
| 6,211,697 B1 * | 4/2001 | Lien et al. | ..................... | 326/41 |
| 6,297,460 B1 * | 10/2001 | Schaper | ...................... | 174/261 |
| 6,430,733 B1 * | 8/2002 | Cohn et al. | ................... | 716/11 |
| 6,602,735 B1 * | 8/2003 | Shyu | .......................... | 438/111 |
| 6,760,900 B1 * | 7/2004 | Rategh et al. | ................ | 716/19 |
| 6,820,248 B1 | 11/2004 | Gan | | |
| 2001/0035568 A1 * | 11/2001 | Shyu | .......................... | 257/666 |
| 2002/0186106 A1 * | 12/2002 | Miller | ........................ | 333/247 |

\* cited by examiner

*Primary Examiner*—Sun James Lin
(74) *Attorney, Agent, or Firm*—Fish & Neave IP Group Ropes & Gray LLP

(57) ABSTRACT

An interconnect zone cell resides within an integrated circuit laid out according to a layout. The integrated circuit includes a first circuit block, laid out according to a first minimum feature size. The integrated circuit further includes a second circuit block, laid out according to a second minimum feature size. The interconnect zone cell includes a coupler that couples a portion of the first circuit block to a portion of the second circuit block.

62 Claims, 22 Drawing Sheets

US 7,073,154 B1

APPARATUS AND METHODS FOR INTERCONNECT ZONES AND ASSOCIATED CELLS IN INTEGRATED CIRCUITS

BACKGROUND

A modern integrated circuit (IC) sometimes includes diverse blocks of circuitry. The blocks of circuitry may have distinct or different origins. The designer of the IC may design and develop one block of circuitry, but rely on a vendor to design, develop, and supply another block of circuitry. The designer may save time, resources, and effort by using the vendor's circuit, rather than design and develop it itself. For example, an IC may include general digital logic as well as a memory. The designer of the IC may choose to design the general digital logic, but turn to a vendor for the memory.

Using blocks of circuitry with different origins, however, may pose certain challenges. Typically, the designer and the vendor may use different computer-aided design (CAD) tools, with diverse requirements, methodology, and output database formats and specifications. For example, the database for the designer's block of circuitry may have a different minimum feature size, grid system, and/or scale than the database for the vendor's block of circuitry and cause grid mismatch and undesired "snap to grid" in a merged database. Furthermore, the designer and the vendor may use different design rules and methodologies, thus complicating the verification process for the blocks of circuitry and the IC. A need exists for circuit verification without combining databases, and for and merging databases so as to preserve the integrity of the blocks of circuitry and of the overall IC.

SUMMARY

This invention contemplates interconnect zone cells and associated layouts and data sets for use in integrated circuits and their corresponding databases. In one embodiment, an interconnect zone cell is adapted to reside within an integrated circuit with a layout. The interconnect zone includes a coupler. The coupler couples a portion of a first circuit block within the integrated circuit to a portion of a second circuit block within the integrated circuit. The first circuit block is laid out according to a first minimum feature size, and the second circuit block is laid out according to a second minimum feature size.

In another embodiment, an integrated circuit includes a first circuit block, a second circuit block, and an interconnect zone cell. The first circuit block is laid out according to a first minimum feature size, and the second circuit block is laid out according to a second minimum feature size. The interconnect zone cell is configured to couple a portion of the first circuit block to a portion of the second circuit block.

In a third embodiment, a layout for an integrated circuit includes a first layout zone, a second layout zone, and an interconnect zone. The first layout zone includes a layout for a first circuit block within in the integrated circuit, and is laid out according to a first minimum feature size. The second layout zone includes a layout for a second circuit block within in the integrated circuit, and is laid out according to a second minimum feature size. The interconnect zone is configured to join the first layout zone to the second layout zone.

Another aspect of the invention relates to methods of using interconnect zone cells and associated layouts and data sets. In one embodiment, method of producing a layout for an integrated circuit includes generating a first layout zone laid out according to a first minimum feature size. The first layout zone includes a layout for a first circuit block within the integrated circuit. The method also includes generating a second layout zone laid out according to a second minimum feature size. The second layout zone includes a layout for a second circuit block within the integrated circuit. The method further entails joining the first layout zone to the second layout zone by using an interconnect zone.

In another embodiment, a method of generating a layout database for an integrated circuit includes generating a first layout database. The first layout database includes a first data set for a first circuit adapted to be included within the integrated circuit, and is laid out according to a first minimum feature size. The method includes generating a second layout database that includes a second data set for a second circuit adapted to be included within the integrated circuit. The second circuit is laid out according to a second minimum feature size. The method further entails combining the first and second layout databases to generate the layout database for the integrated circuit.

DESCRIPTION OF THE DRAWINGS

The appended drawings illustrate only exemplary embodiments of the invention and therefore should not be considered as limiting its scope. The disclosed inventive concepts lend themselves to other equally effective embodiments. In the drawings, the same numeral designators used in more than one drawing denote the same, similar, or equivalent functionality, components, or blocks.

DETAILED DESCRIPTION

Figure 1:
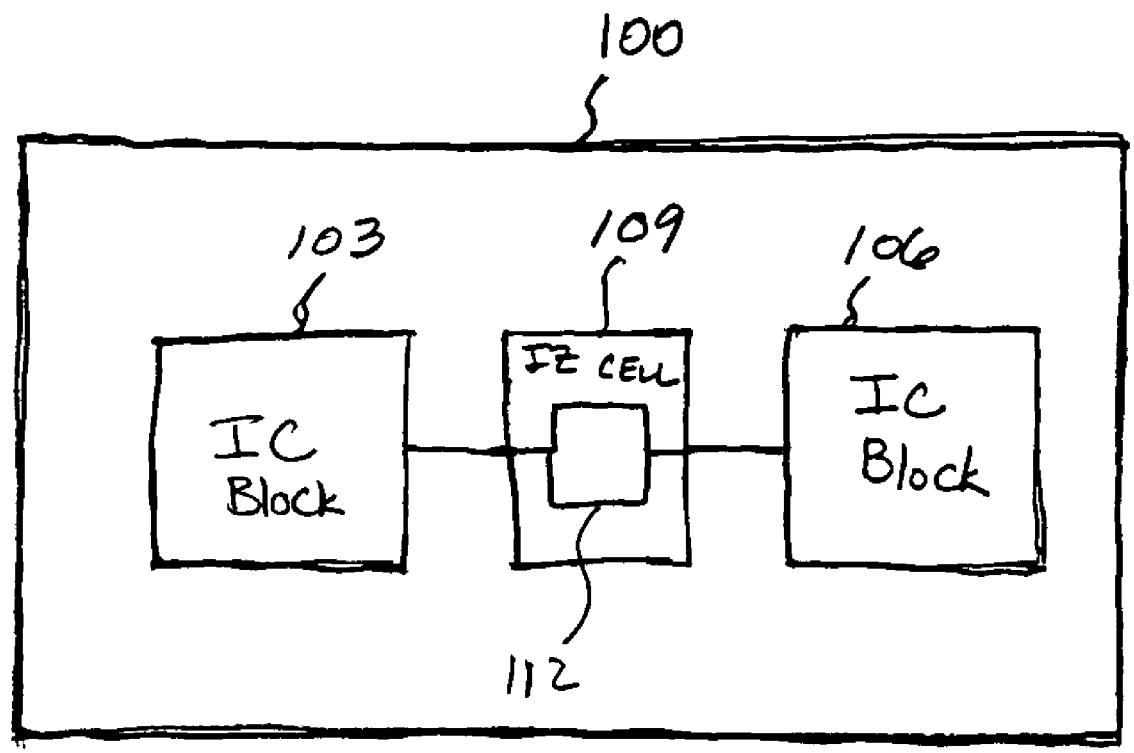
FIG. 1 shows an exemplary embodiment of an electrical schematic of an IC according to the invention.

This invention contemplates apparatus and methods for verifying individually and for combining or merging databases drawn to different processes, minimum feature sizes, and/or scales or grid systems. The inventive concepts provide solutions to the problems encountered in verification and merger of the two databases so as to produce an IC that corresponds to both databases and that meets desired design and performance specifications.

One may use the inventive concepts in several situations that may arise under various circumstances and that involve databases with minimum feature sizes, which may be drawn to different processes and/or scales or grid systems. For example, a first IC block (including a block of circuitry to perform various functions) may already exist, and the designer may wish to add a second IC block (that includes a block of circuitry to perform additional functions) and combine the first and second IC blocks within a single IC. As another example, one designer may design and develop a first IC block independently from another designer that designs and develops a second IC block, both for final inclusion in an IC.

The IC blocks may generally correspond to, and include, a wide variety of circuitry. For example, the first IC block may constitute general-purpose IC circuitry or special-purpose IC circuitry, such as circuitry for a programmable logic device (PLD), for example, programmable or configurable interconnects and logic circuits. The second IC block may also include general-purpose, dedicated, or special-purpose circuitry or, generally, circuitry that performs functions in addition to the functions of the first IC block. A non-exclusive list of examples of circuitry within second IC blocks includes controllers, memory, processors, microprocessors, microcontrollers, or intellectual property (IP) blocks supplied by another party. Thus, each of the first and second IC blocks (or more than two IC blocks, as desired) includes a portion of the circuitry within the overall IC that includes the first and second IC blocks.

Each of the IC blocks have a corresponding data set that resides within a corresponding database (or more than one database, as desired, depending on the methodology). The data sets include specific information about their corresponding IC blocks, such as netlist, layout, and the like. Typically, one combines the databases for the various IC blocks to generate an overall IC database (or more than one database, as desired, depending on the methodology). Thus, the IC database includes a data set for the overall IC.

The IC blocks may have differing minimum feature sizes. Furthermore, designers may design and layout the IC blocks using different CAD tools and with different design methodologies in mind. The CAD tools and design methodologies may use dissimilar scales or grid systems. For example, a designer may design the first IC block and produce its data set corresponding a 0.25μ minimum feature size, whereas another designer may design the second IC block and produce its and related data set corresponding to a 0.18μ minimum feature size.

The databases corresponding to the IC blocks may also use different minimum feature sizes grid sizes, drawing layers, and/or device definitions. When combining or merging databases drawn to different minimum feature sizes at a mask shop, a database or components within it may end up "off-grid" within the mask shop's grid system. When the mask shop re-scales or shrinks the database by some factor, some of the points of the polygons corresponding to the layout of the circuitry within the database may snap to a grid. For example, a point of a polygon originally aligned using one grid system and corresponding to one minimum feature size snaps to another grid point when one rescales or shrinks the database. As a result, the original layout and design may change in an undesired manner. Alignment problems between individual polygons and between masks may result. Polygons may snap to grid points in unpredictable ways and cause misalignment. Consequently, the database and/or the resulting IC may no longer satisfy design rules, performance specifications, or both.

Furthermore, dissimilar design methodologies for the various IC blocks may make verification more complicated. Verification of the IC blocks typically entails checking the respective designs for design rule compliance (design rule check or "DRC"), and for layout-versus-schematic (LVS) verification. Conventional verification would entail combining the databases for the IC blocks and performing verification on the resulting database. Several factors may make such a verification process complicated, impossible, or impractical.

The designs for the different IC blocks may reside or exist on different layers. The design for the first IC block and the design for the second IC block may reside on different GDS2 layers (a format commonly used to facilitate IC layout and manufacture). Verification may entail combining the various layers, which may be a complex and lengthy process that may prove impractical for multifaceted designs.

Also, the designs for the first and second IC blocks may further use dissimilar device definitions, further complicating the task. Moreover, the mask shop may wish to apply different mask biases or CAD biases (additional change to the geometry to ensure proper final feature sizes) for the various databases. A combined database may not allow the mask shop to do so.

The apparatus and methods according to the invention use interconnect zones (including associated circuitry, such as interconnect zone cells that include couplers, as described below in detail) included within the databases for the IC blocks to be merged. Use of the interconnect zones (IZ) avoids the grid and/or scale problems described above and further allow verification of individual IC blocks without combining them. Note that, although in exemplary embodiments, the IC blocks have differing minimum feature sizes, one may also apply the inventive interconnect zone cells and associated layouts and data sets to a situation where the IC blocks have the same minimum feature size.

FIG. 1 shows an exemplary embodiment of an electrical schematic of an IC 100 according to the invention. IC 100 includes a first IC block 103, a second IC block 106, and interconnect zone cell 109. Interconnect zone cell 109 couples to first IC block 103. Interconnect zone cell 109 also couples to second IC block 106.

Interconnect zone cell 109 includes a coupler 112 that provides a coupling mechanism between first IC block 103 and second IC block 106. Note that one may include more than one coupler 112 within an interconnect zone cell 109 to communicate more than one signal between first IC block 103 and second IC block 106, as desired.

The first IC block has a layout corresponding to a minimum feature size and grid system or scale, whereas the second IC block has a layout corresponding to another minimum feature size and grid system or scale. Design and development of the IC blocks entails generating and using a first database that includes a data set for the first IC block (including its layout) and a second database that includes a data set for the second IC block (including its layout). Interconnect zone cell 109 (and its associated layout, the interconnect zone, as described below) allows merging the first and second databases without the grid problems described above. Furthermore, interconnect zone cell 109 provides for individual verification, e.g., DRC, LVS, or both, of the data sets (included within individual databases) for the first and second IC blocks, without the need for merging the first and second databases.

Interconnect zone cell 109 denotes a shared cell that resides within both the first and second databases. Interconnect zone cell 109 may reside on a desired GDS2 layer (or corresponding abstract or layer in other layout systems and methodologies), for example, layer 199, within both the first and second databases. Thus, the first and second databases share interconnect zone cell 109 on that particular GDS2 layer. The shared nature allows changes to the interconnect zone cell 109 to be passed between the databases. Designers may make modifications to the interconnect zone cell 109 and pass the data set corresponding to the cell from one database to another.

More specifically, designers of the first IC block may change the interconnect zone cell 109 or the data set corresponding to it and pass the modified design and data to the designers of the second IC block, and vice-versa. For example, designers of the first IC block may select a new position for a coupler (or a plurality of couplers) within the interconnect zone cell 109 and then pass the information to the designers of the second IC block (through exchanging the corresponding cell and data set). The sharing of the interconnect zone cell 109 also ensures that CAD biases applied to the databases do not cause broken interconnects or traces and do not lead to gaps in the traces or interconnects within the IC.

Through coupler 112 (or a plurality of such couplers), interconnect zone cell 109 provides a coupling mechanism for communicating signals between the first and second IC blocks. Note that one may generally include other features and circuitry within interconnect zone cell 109 and/or coupler 112, as desired. For example, one may include resistors, transistors, diodes, and the like, or one or more collections of those elements, such as buffers, gates, logic circuits, or other circuit, as desired. As noted above, one may include more than one coupler 112 in an IC according to the invention, as desired, in order to facilitate communication of a plurality of signals between IC blocks.

Interconnect zone cell 109 is drawn (designed and/or laid out) so that it aligns properly with grid points of the mask shop's grid system (or generally, the grid system for the overall IC), whether it appears in a database (one of the databases corresponding to the IC blocks) with its original scale or whether it appears in a rescaled or shrunk database. Generally, one may draw interconnect zone cell 109 to the scale or grid system of either the first IC block (and its corresponding database) or the second IC block (and its corresponding database). One may specify dimensions for coupler 112 (or a plurality of couplers 112) so that an original version or a rescaled version of the database containing it aligns properly with the grid for the overall IC (the mask shop's grid).

One may use a common denominator between the minimum features sizes for the two IC blocks to ensure that the layout of interconnect zone cell 109 (and coupler 112 within interconnect zone cell 109) aligns properly when one shrinks or rescales one database so that it matches the grid spacing of the overall IC database. For example, by using a 1μ×3μ rectangle as the layout for interconnect zone cell 109, the four corners of the rectangle align with an overall 0.05μ IC grid, whether one uses the original size of the rectangle or shrinks it by 25%. Thus, if the databases for two IC blocks include the 1μ×3μ rectangle, one may use one database with its original scale and shrink by 25% the second database and still ensure that both databases align properly with the overall 0.05μ IC grid. The layout corresponding to interconnect zone cell 109 has the same origin as the first and second databases, so that it aligns properly when the mask shop combines the databases.

Figure 2:
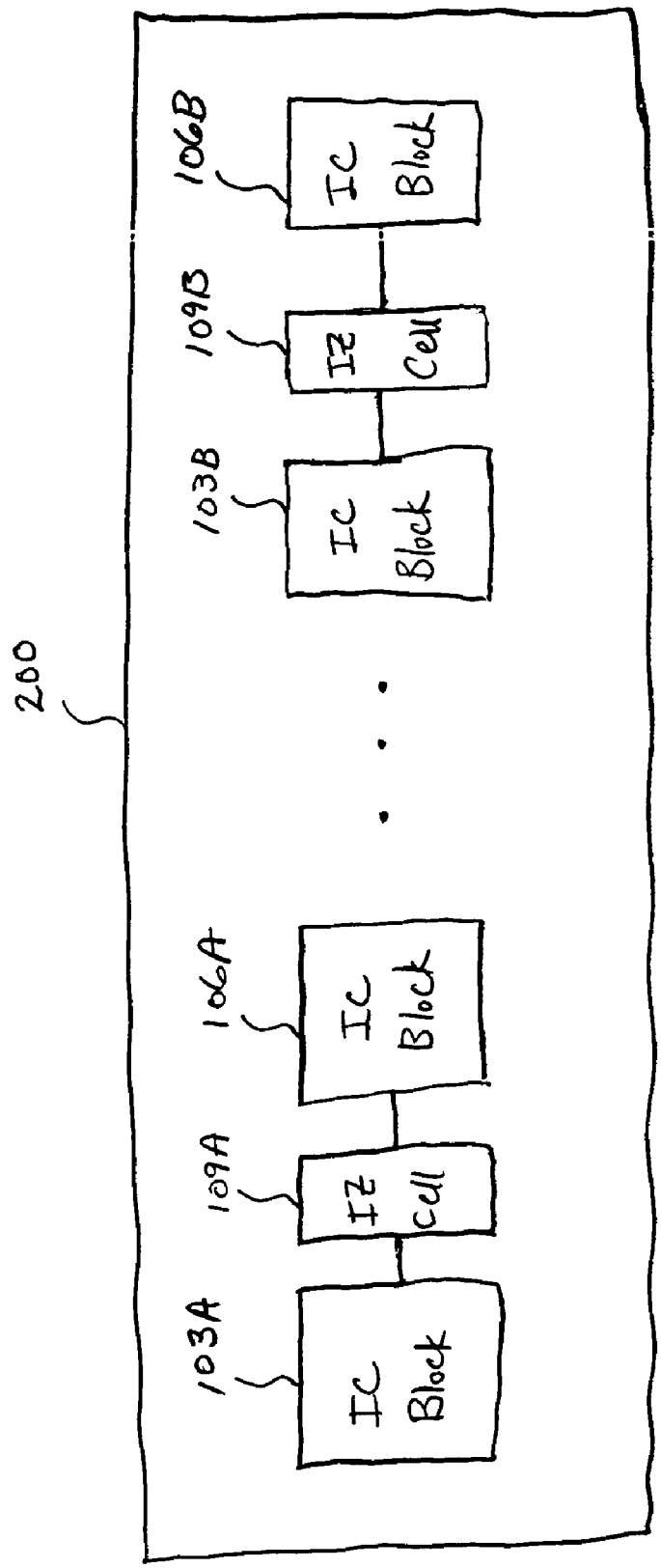
FIG. 2 illustrates another exemplary embodiment of an electrical schematic for an IC according to the invention.

One may extend the interconnect zone concept to situations where an IC includes more than two IC blocks. FIG. 2 shows another exemplary embodiment of an electrical schematic for an IC 200 according to the invention. IC 200 includes blocks and cells similar to those in IC 100, and the blocks and cells function in a similar manner to those in IC 100. IC 200, however, includes multiple interconnect zone cells and associated IC blocks. In other words, IC 200 corresponds to a situation where one desires to include within an overall IC more than two IC blocks, and the IC blocks have more than one scale or grid system and verification methodologies and/or procedures. IC 200, including the interconnect zone cells included within it, provide similar advantages to those described above in connection with IC 100.

Note that the interconnect zone cells 109A–109B in IC 200 have similar structures to interconnect zone 109 in IC 100. Thus, each interconnect zone cell within IC 200 includes one or more couplers (not explicitly shown in FIG. 2).

IC 200 includes a plurality of IC block-interconnect zone combinations, denoted as IC blocks 103A–103B and interconnect zone cell 109A, and IC blocks 106A–106B and interconnect zone cell 109B. Each of the IC block-interconnect zone combinations has a similar structure and properties to, and operates in a like manner, as those described in connection with IC 100 in FIG. 1.

Interconnect zone 109A couples to IC block 103A and to IC block 106A. The respective databases corresponding to IC blocks 103A and 106A share the data set for interconnect zone 109A, as described above. Interconnect zone 109B couples to IC block 103B and to IC block 106B. The respective databases corresponding to IC blocks 103B and 106B share the data set for interconnect zone 109B, as described above.

Using interconnect zone cells according to the invention entails laying out the interconnect zone cells and the corresponding IC blocks within the overall IC that includes them. In accordance with the invention, an interconnect zone, which corresponds to a layout for an interconnect zone cell, joins the layouts of IC blocks with differing minimum feature sizes, scales, grid systems, device definitions, and/or verification.

Figure 3:
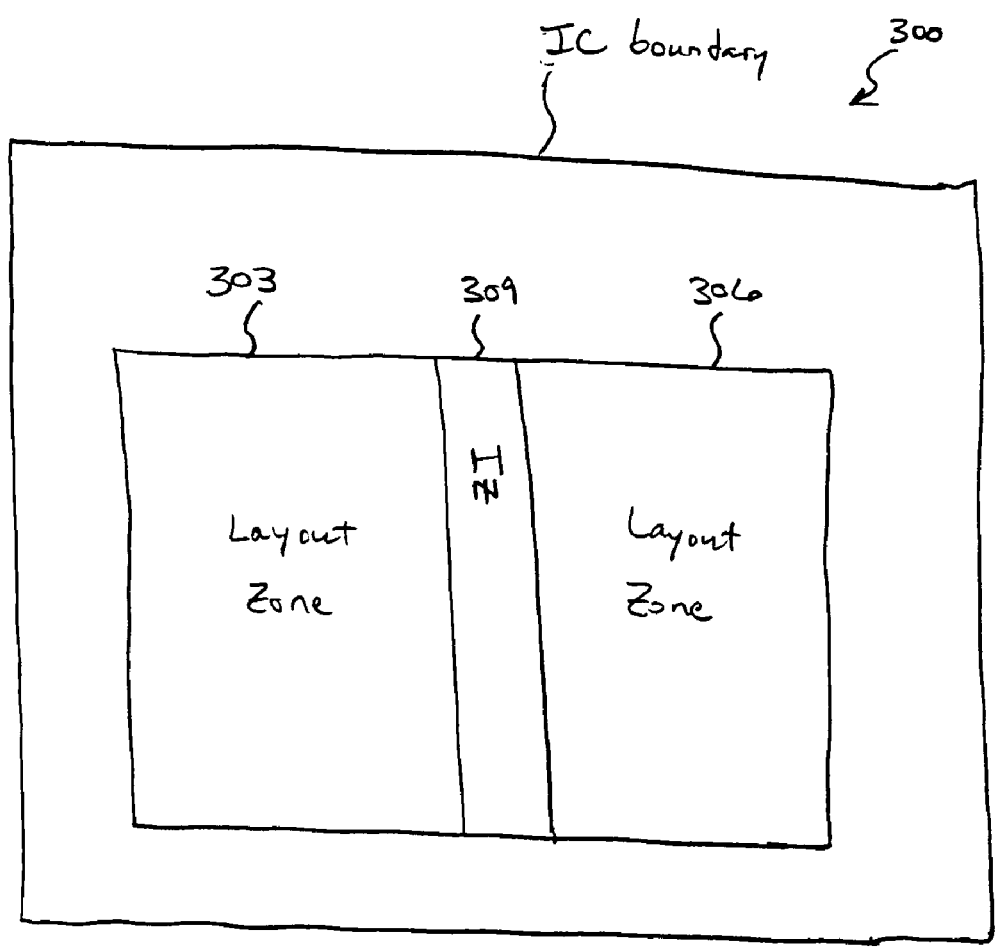
FIG. 3 depicts an exemplary embodiment of a layout for an IC according to the invention.

FIG. 3 shows an exemplary embodiment of a layout 300 for an IC according to the invention. Layout 300 includes first layout zone 303 and second layout zone 306. First and second layout zones 303 and 306 correspond, respectively, to layouts for first and second IC blocks, such as the IC blocks 103 and 106 in FIG. 1, or IC blocks 103A–103B and 106A–106B in FIG. 2. Layout 300 also includes interconnect zone 306. Interconnect zone 306 corresponds to a layout of an interconnect zone cell, such as the cells shown and described in connection with FIGS. 1 and 2.

As FIG. 3 illustrates, interconnect zone 309 resides between, and is adjacent to, first layout zone 303 and second layout zone 306. In other words, on one of its sides, interconnect zone 309 neighbors first layout zone 303, and on an opposite side, interconnect zone 309 neighbors first layout zone 306. From an IC layout point of view, interconnect zone 306 (denoting the layout for the interconnect zone cell) abuts first layout zone 303 on one side and further abuts second layout zone 306 on another side. To generate this arrangement, one juxtaposes or lays out interconnect zone 306 between first layout zone 303 and second layout zone 306.

Figure 4:
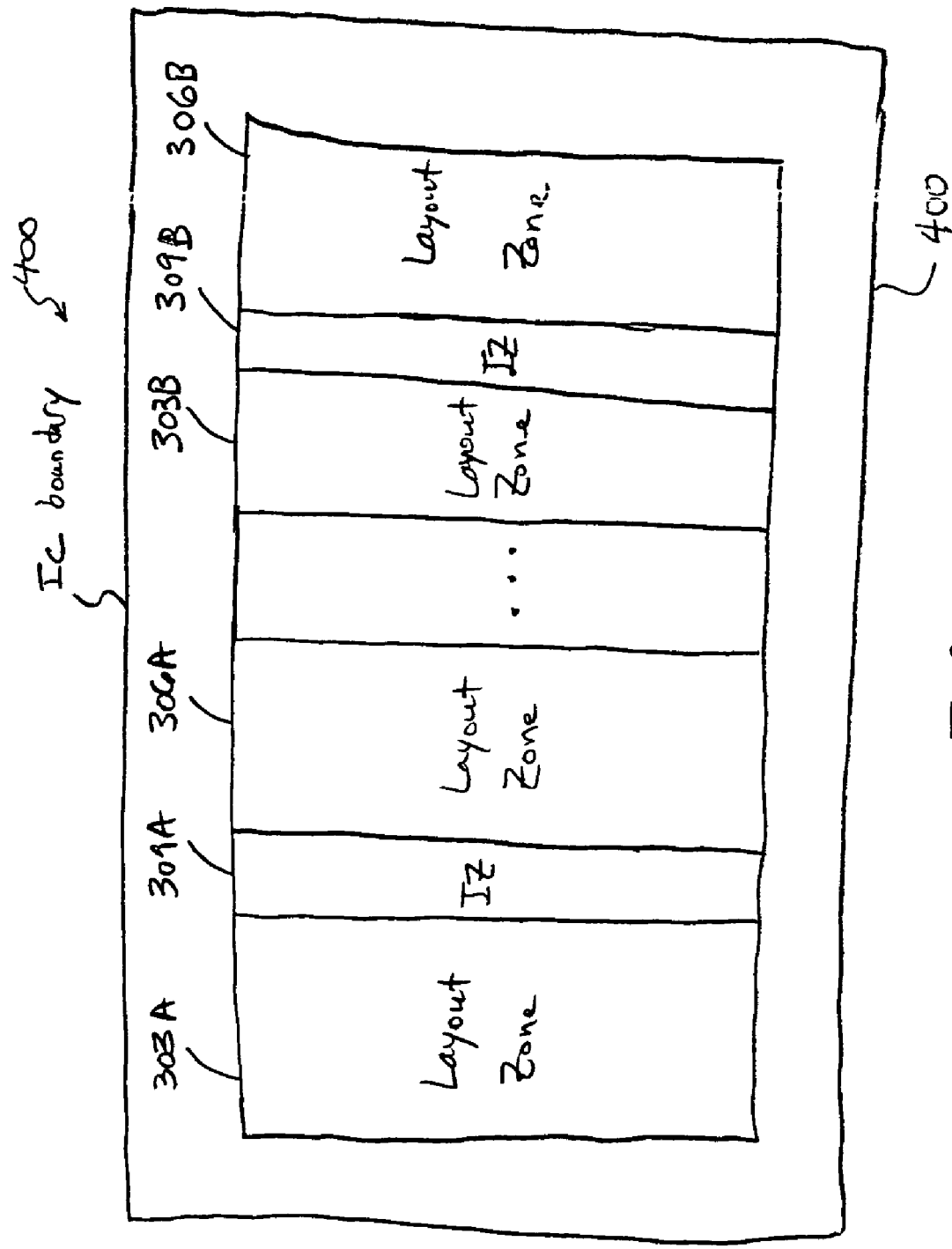
FIG. 4 shows an exemplary embodiment of a layout that includes multiple layout zone-interconnect zone combinations for an IC according to the invention.

Note that one may extend the layout arrangement shown in FIG. 3 to an IC that includes multiple IC blocks and, hence, multiple interconnect zone cells (for example, IC 200 discussed above). FIG. 4 depicts an exemplary embodiment of a layout 400 that includes two or more layout zone-interconnect zone combinations for an IC according to the invention. In each combination, the interconnect zone (corresponding to the layout of an interconnect zone cell of the IC) has a similar relationship to the neighboring layout zones (each corresponding to the layout of an IC block) described in connection with FIG. 3. One such combination that has the layout arrangement shown in FIG. 4 (see also FIG. 3) includes layout zone 303A, layout zone 306A, and interconnect zone 309A. Another similar combination includes layout zone 303B, layout zone 306B, and interconnect zone 309B.

Figure 5:
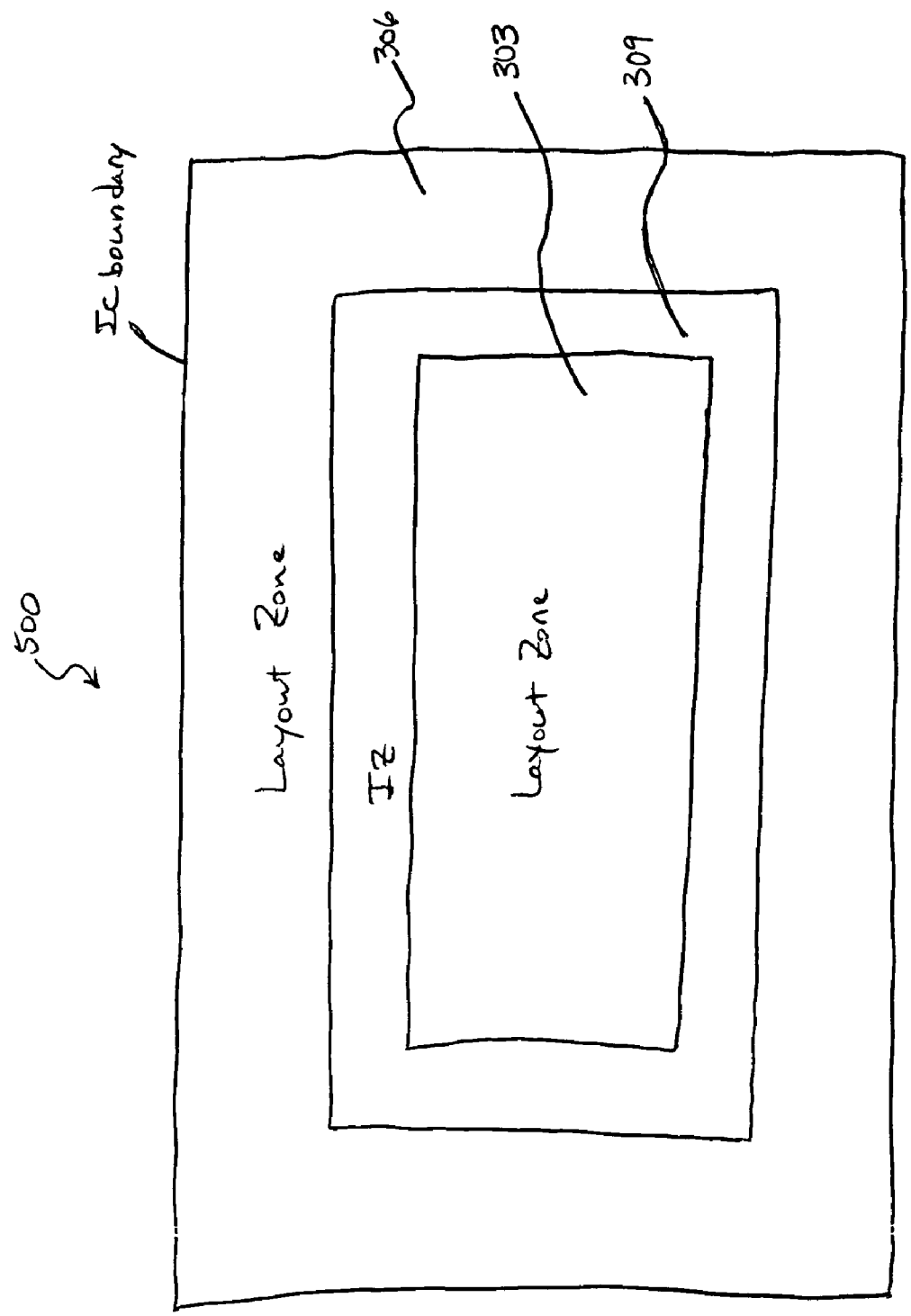
FIG. 5 illustrates another exemplary embodiment of a layout for an IC according to the invention.

One may also lay out an IC that includes one or more interconnect zone cells in other ways. FIG. 5 shows another exemplary embodiment of a layout 500 for an IC according to the invention. Layout 500 includes first layout zone 303 and second layout zone 306. First and second layout zones 303 and 306 correspond, respectively, to layouts for first and second IC blocks, such as the IC blocks 103 and 106 in FIG. 1 or IC blocks 103A–103B and 106A–106B in FIG. 2. Layout 500 further includes interconnect zone 306, which corresponds to a layout of an interconnect zone cell, such as the cells shown and described in connection with FIGS. 1 and 2.

In layout 500, interconnect zone 306 resides between, and is adjacent to, first layout zone 303 and second layout zone 306. In other words, from an IC layout point of view, interconnect zone 309 abuts on each of inner sides a corresponding side of first layout zone 303. Furthermore, interconnect zone 309 abuts on each of its outer sides a corresponding side of second layout zone 306. To generate this arrangement, one lays out interconnect zone 309 so that it surrounds first layout zone 303, and further lays out second layout zone 306 such that it surrounds interconnect zone 309. Thus, interconnect zone 309 resides between first layout zone 303 and second layout zone 306.

Figure 6A:
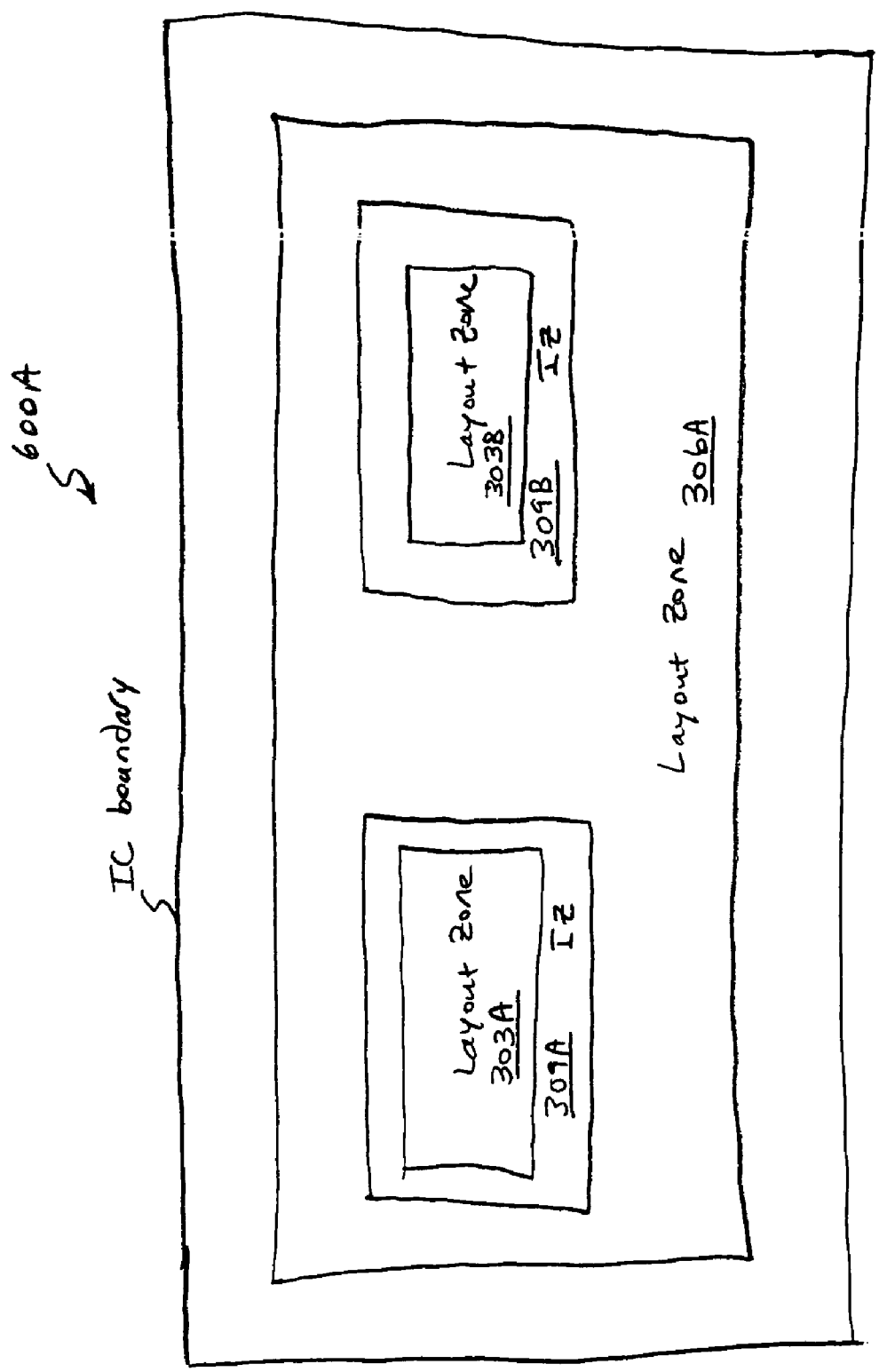
FIG. 6A depicts another exemplary embodiment of a layout for an IC according to the invention that includes multiple layout zone-interconnect zone combinations.
Figure 6B:
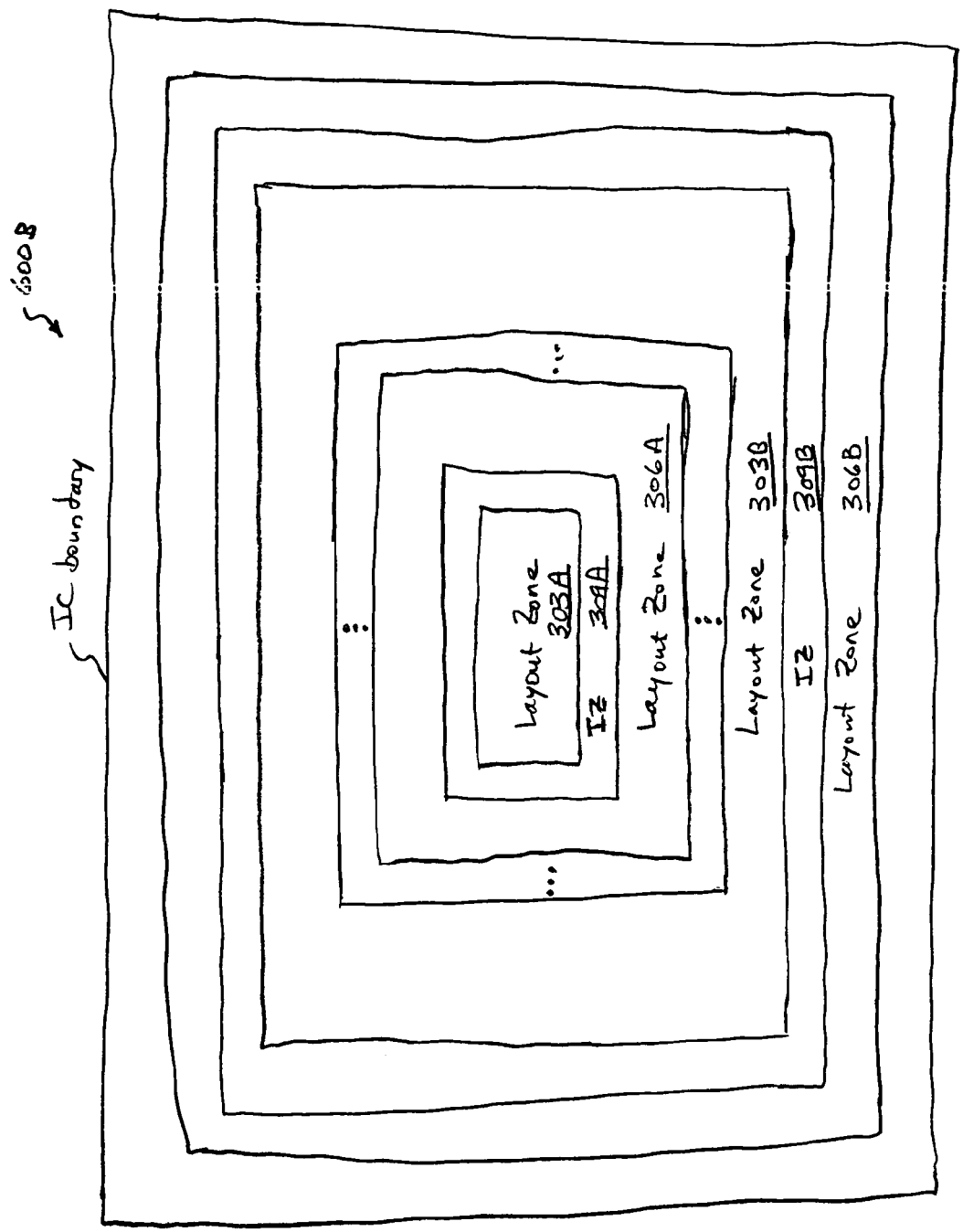
FIG. 6B illustrates another exemplary embodiment of a layout that includes multiple layout zone-interconnect zone combinations for an IC according to the invention.

One may apply the layout arrangement in FIG. 5 to an IC that includes multiple IC block-interconnect zone cell combinations (for example, IC 200 discussed above). FIGS. 6A and 6B illustrate examples of layouts according to the invention for such IC.

FIG. 6A depicts an exemplary embodiment of a layout 600A for an IC according to the invention that includes multiple layout zone-interconnect zone combinations. More specifically, IC layout 600A includes two layout zones 303A and 303B, each corresponding to an IC block, arranged within another layout zone 306A, corresponding to a third IC block. As an example, layout zones 303A–303B may correspond to two processors included within the larger layout zone 306A, which corresponds to a PLD.

Similar to the arrangement shown in FIG. 5, in layout 600A, interconnect zone 309A resides between layout zone 303A and layout zone 306A. More specifically, interconnect zone 309A surrounds layout zone 303A. Likewise, interconnect zone 309B resides between layout zone 303B and layout zone 306A. Put another way, interconnect zone 309B surrounds layout zone 303B. Note that one may extend the arrangement shown in FIG. 6A to ICs that include more than three IC blocks (for example, four processors within a PLD) and two interconnect zones, as persons of ordinary skill in the art who have the benefit of the disclosure of the invention understand.

FIG. 6B depicts another exemplary embodiment of a layout 600B that includes multiple layout zone-interconnect zone combinations for an IC according to the invention. In each combination, the interconnect zone (corresponding to the layout of an interconnect zone cell in the IC) has a similar relationship to the neighboring layout zones (each corresponding to the layout of an IC block) as described in connection with FIG. 5. One such combination that has the layout arrangement shown in FIG. 6B (see also FIG. 5) includes layout zone 303A, layout zone 306A, and interconnect zone 309A. Another similar combination includes layout zone 303B, layout zone 306B, and interconnect zone 309B, and so on. As persons of ordinary skill in the art with the benefit of the description of the invention understand, one may extend the layout arrangement in FIG. 6B to ICs that include more layout zones and more interconnect zones, as desired.

One may use the layouts shown in FIGS. 3–6 to generate databases for producing and/or manufacturing ICs. Each of the layout zones shown in the figures may reside within an individual database, as desired. Generally, one may include within individual databases the data set and layout for any part of the IC that has a grid system, scale, device definition, and/or verification that differs from other parts of the IC. As noted above, when an interconnect zone joins two layout zones, the databases for the two layout zones each include the data set for the interconnect zone (i.e., they share the data set for the interconnect zone). If a given layout zone joins more than one other layout zone, the database may include data sets for a corresponding number of interconnect zones so that it may share each of the interconnect zones with a corresponding layout zone.

Figure 7:
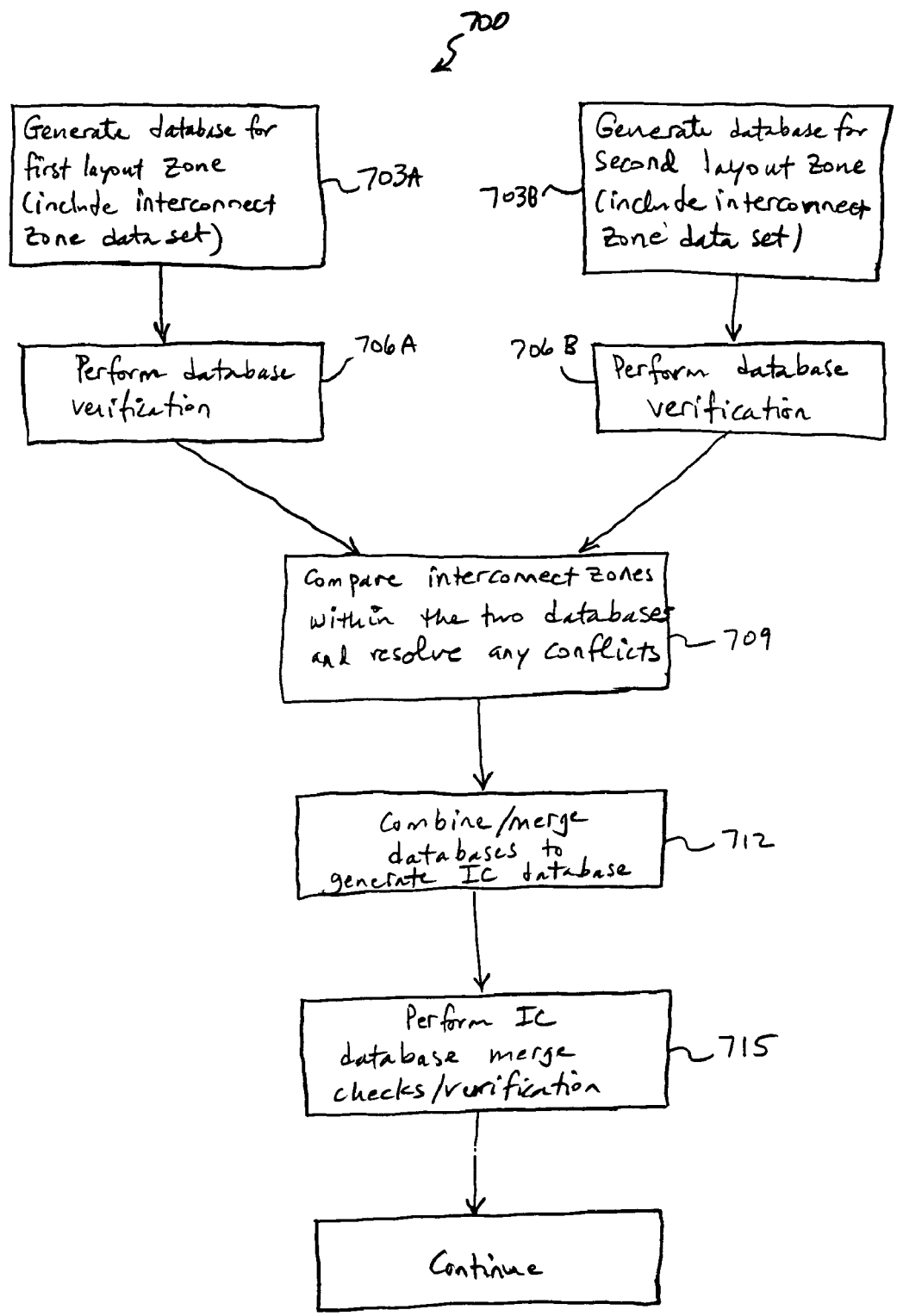
FIG. 7 shows an exemplary flow diagram for generating a database suitable for use in production and/or manufacture of an IC according to the invention.

FIG. 7 illustrates an exemplary flow diagram 700 for generating a database suitable for use in production and/or manufacture of an IC according to the invention. One may apply the process shown in flow diagram 700 to generate databases from the layouts in FIGS. 3–6. In situations that involve more than two layout zones, one may repeat steps 703A and 706A (or 703B and 706B) for each additional layout zone and its corresponding database.

The process begins at steps 703A and 703B by generating databases for the first layout zone and the second layout zones within the IC layout. Each database includes the interconnect zone, which corresponds to the data set or layout for the shared interconnect zone cell.

The process further includes database verification at steps 706A and 706B for the databases corresponding to the first and second layout zones, respectively. Because each of the databases generated at steps 703A and 703B includes the appropriate shared interconnect zone, one may perform verification of each database individually and its own design/verification environment. As noted above, the verification may include DRC and LVS procedures, and may further include other verification, as persons skilled in the art with the benefit of the description of the invention understand.

Note that one may optionally include interactions between the process steps for generating databases for the first and second layout zones, as desired. For example, one may include a step for passing back and forth the data set for the interconnect zone and/or interconnect zone cell between the two designers or design groups, as described above. As another possibility, one may resolve the design and layout of the interconnect zone cell before steps 703A and 703B commence. Note further that one may perform steps 703A–706A in parallel with steps 703B–706B. Alternatively, one may perform steps 703A–706A before steps 703B–706B, or vice-versa.

As an optional check, at step 709 one may next compare the interconnect zones within the databases corresponding to the two layout zones and resolve any conflicts or differences. Next, at step 712, one combines or merges the databases to generate an overall IC database. One may use the overall IC database to generate masks for the IC and to produce and manufacture the IC. One may further perform merger checks and/or verification of the IC database at step 715, as desired.

Figure 8:
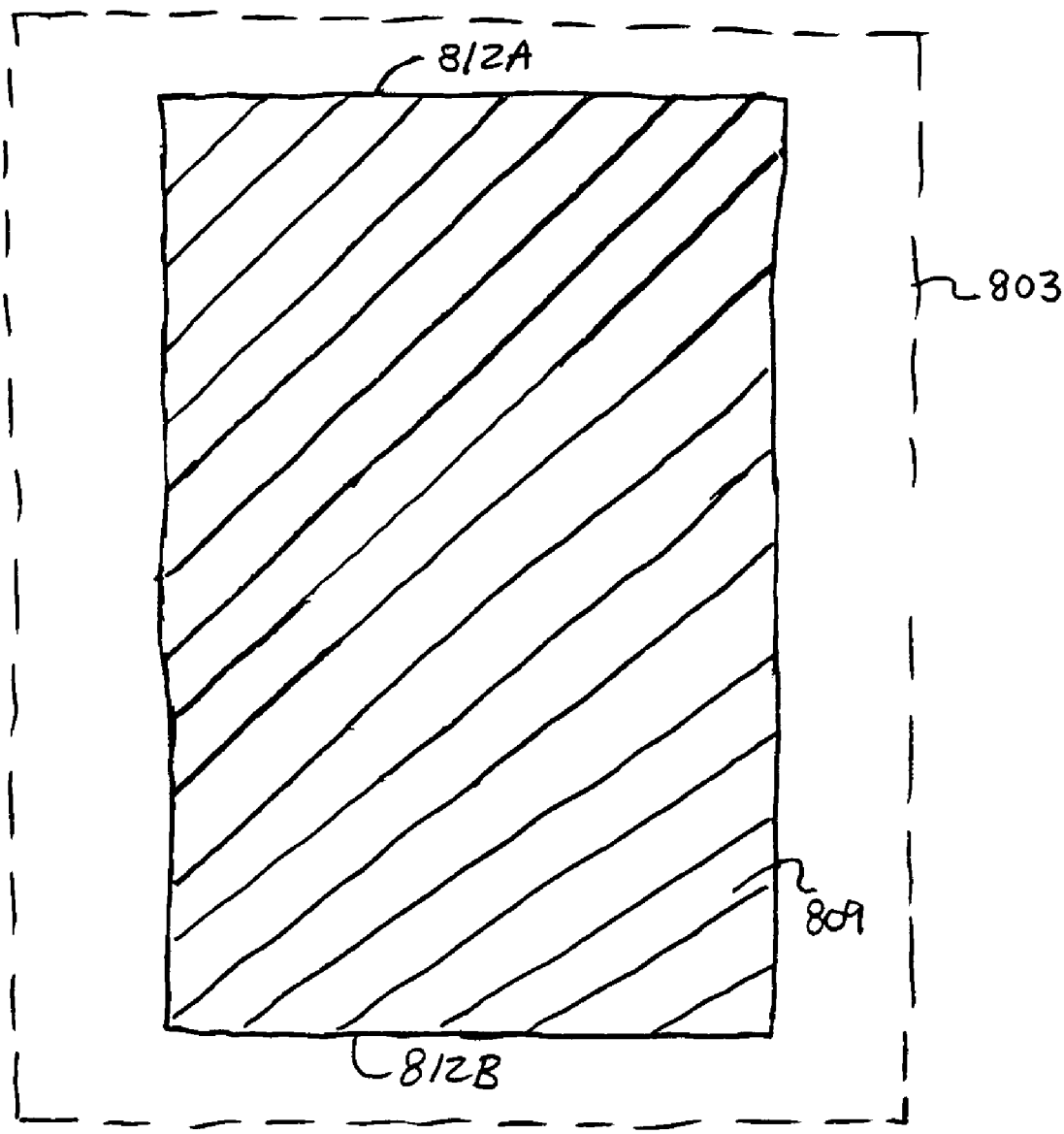
FIG. 8 illustrates an exemplary embodiment of an interconnect zone according to the invention.

FIG. 8 shows an exemplary embodiment of an interconnect zone according to the invention. The interconnect zone resides within layer 803. Layer 803 may constitute a GDS2 layer, such as GDS2 layer 199 or another GDS2 layer, as desired.

As noted above, interconnect zone cell 109 includes coupler 112 (or more than one coupler, as desired). Accordingly, the interconnect zone in FIG. 8 includes a layout 809 for coupler 112. Coupler layout 809 is drawn and laid out so that its location coincides with a grid point within the overall IC grid system (whether the overall IC database includes a database with its original scale or re-scaled or shrunk). As described above, one selects the dimensions and layout of coupler layout 809 so that it aligns with the overall IC grid (e.g., the mask shop grid), whether one uses the original scale of coupler 809 or whether one shrinks or rescales it by a specified amount. One thus ensures that when one combines the databases corresponding to the IC blocks, such as first IC block 103 and second IC block 106 in FIG. 1, the interconnect zone aligns properly within the IC grid system. (Note that the databases for first IC block 103 and second IC block 106 both include the interconnect zone data set.)

As noted above, coupler 112 within the interconnect zone cell provides a way of coupling a portion of the circuitry within one IC block to a portion of the circuitry within another IC block. To do so, a node in one IC block and a node in another IC block both couple to the coupler, thus establishing a communication path between the two IC blocks. In other words, through interconnect zone cell 109 and associated coupler 112, one IC block may provide one or more signals to another IC block and/or receive one or more signals from the other IC block. Thus, one may communicate a variety of signals between two IC blocks, as desired. Examples of signals include bus signals, data signals, address signals, control signals, status signals, power buses, input signals, and output signals. Note that, as described above, one may include within interconnect zone cell 109 a plurality of couplers 112, where each coupler 112 communicates one signal between the IC blocks, as desired.

One may use a variety of materials to implement couplers 112 within interconnect zone cells 109 in ICs according to the invention. The choice of material for, and the implementation of, coupler 112 depends generally on the semiconductor technology and IC circuitry and functionality desired. For example, in a complementary metal oxide semiconductor (CMOS) technology, one may use metal, polysilicon, and/or doped silicon to implement coupler 112. As a result, the layout for the interconnect zone cell, i.e., the interconnect zone, would include a metal region, a polysilicon region, and/or a doped semiconductor region. Similarly, in other semiconductor technologies (e.g., gallium-arsenide, silicon carbide, and silicon-germanium), one may use a material suitable for implementing coupler 112 and coupling two parts of the IC, such as metal, semiconductor, etc.

Coupler 112 may constitute a variety of structures. The choice of structure depends on the semiconductor technology used and the materials available for the fabrication of the IC that includes interconnect zone cells and their corresponding interconnect zone, and/or the design and functionality of the circuitry within the IC. For example, in a CMOS process, one may use a metal pin, a via, a region of doped silicon, or even structures (such as transistors, resistors, diodes, etc.)

To couple two IC blocks via an interconnect cell, a portion of the circuitry within one IC block couples to boundary 812A of coupler layout 809. Similarly, a portion of the circuitry within the other IC block couples to boundary 812B of coupler layout 809.

One may design and layout interconnect zone cells according to a given set of design rules, as desired. A set of design rules may specify various aspects of an interconnect zone cell and its layout (i.e., the interconnect zone), such as feature size, spacing, and the like. FIGS. 9–17 illustrate a set of exemplary design rules that one may use in various embodiments of the invention. Note that, for the sake of clarity, FIGS. 9–17 illustrate a portion of the interconnect and layout zones pertinent to a given rule, rather than the entire interconnect and layout zones.

Figure 9:
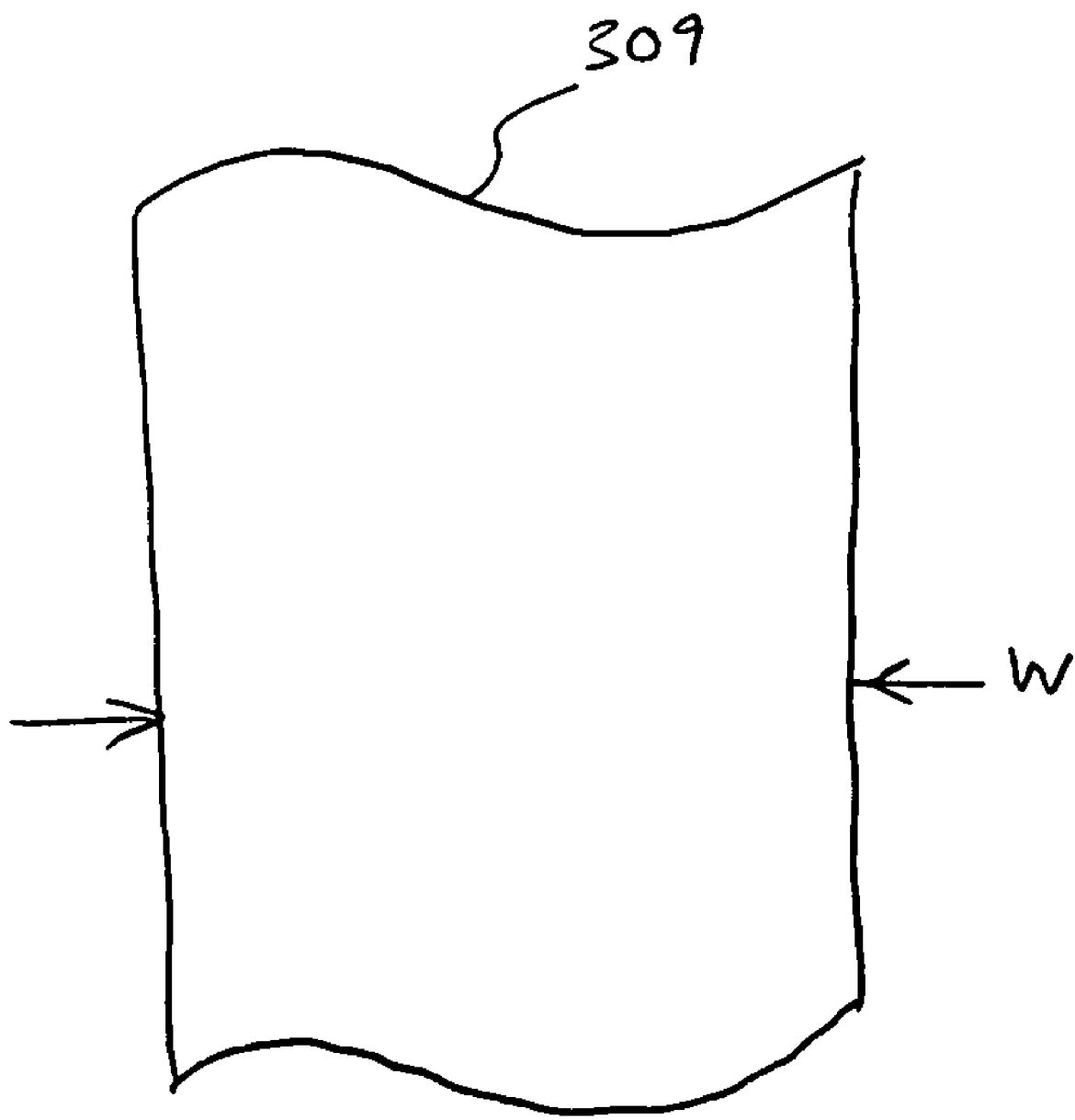
FIG. 9 shows a layout arrangement corresponding to a first exemplary design rule for an interconnect zone according to the invention.

FIG. 9 depicts a layout arrangement corresponding to a first exemplary design rule for an interconnect zone according to the invention. Specifically, the layout arrangement specifies a minimum width, W, for interconnect zone 309.

Figure 10:
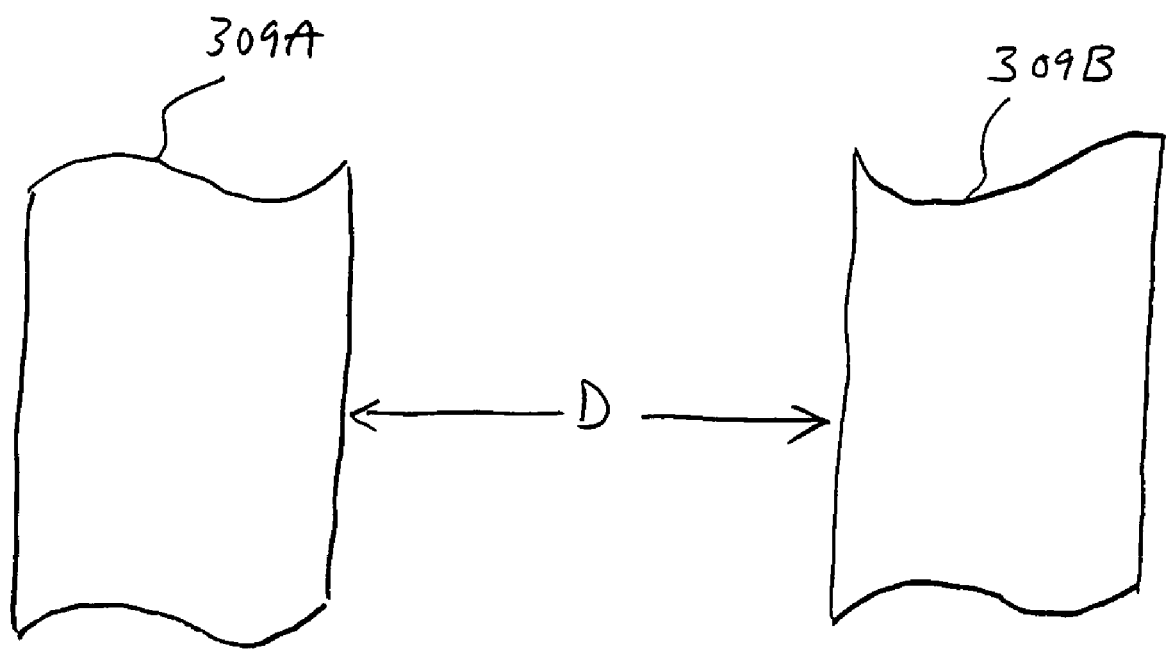
FIG. 10 illustrates a layout arrangement that corresponds to a second exemplary design rule for an interconnect zone according to the invention.

FIG. 10 shows a layout arrangement that corresponds to a second exemplary design rule for an interconnect zone according to the invention. The second exemplary design rule specifies a minimum distance, D, between interconnect zone 309A and interconnect zone 309B.

Figure 11:
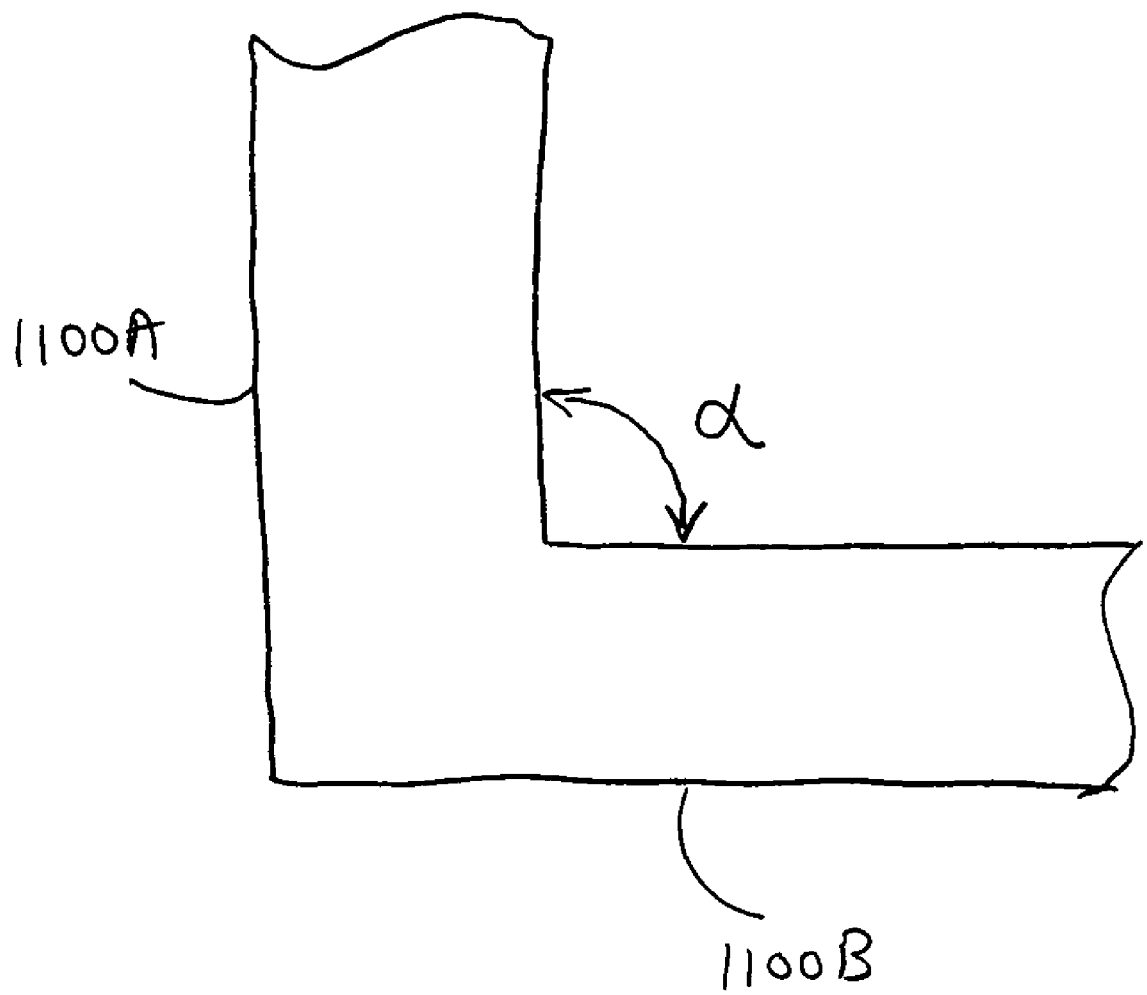
FIG. 11 illustrates a layout arrangement corresponding to a third exemplary design rule for an interconnect zone according to the invention.

FIG. 11 depicts a layout arrangement corresponding to a third exemplary design rule for an interconnect zone according to the invention. The layout arrangement specifies an angle, α, between trace 1100A and trace 1100B, which constitute parts of an interconnect zone. Trace 1100A and trace 1100B may, for example, constitute metal traces at a corner of interconnect zone 301 in FIG. 5. In an exemplary set of design rules, angle α may be a right angle, or 90°, although one may specify other angles, as persons of ordinary skill in the art who have the benefit of the description of the invention understand.

Figure 12:
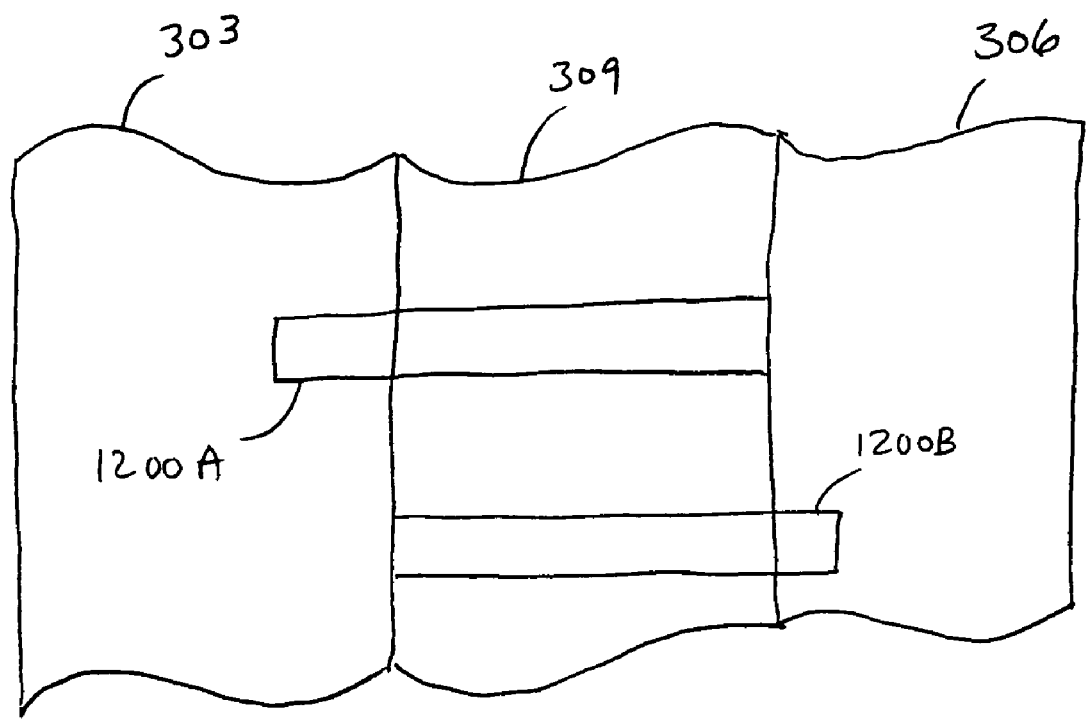
FIG. 12 depicts a layout arrangement that corresponds to a fourth exemplary design rule for an interconnect zone according to the invention.

FIG. 12 illustrates a layout arrangement that corresponds to a fourth exemplary design rule for an interconnect zone according to the invention. This rule specifies that no data from an interconnect zone may extend outside that interconnect zone. In other words, according to the rule, the data inside an interconnect zone should remain within the boundaries of the interconnect zone. Referring to the figure, trace 1200A and trace 1200B do not meet the requirements of the rule because they extend outside interconnect zone 309 and into first layout zone 303 and second layout zone 306, respectively.

Figure 13:
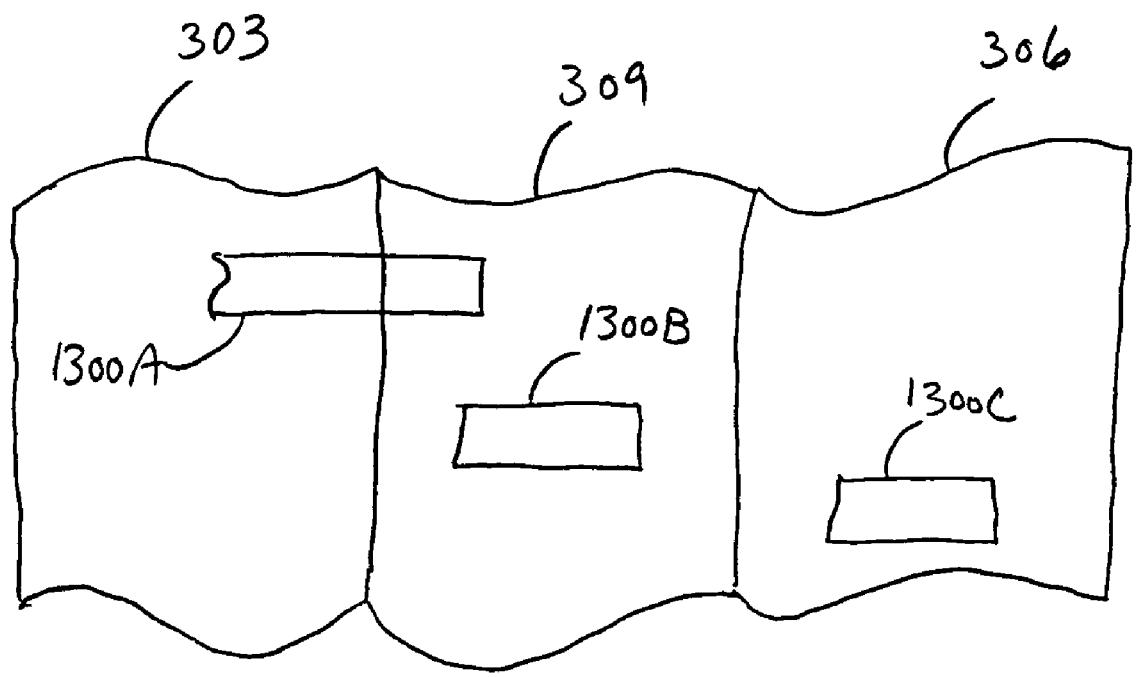
FIG. 13 shows a layout arrangement corresponding to a fifth exemplary design rule for an interconnect zone according to the invention.

FIG. 13 depicts a layout arrangement corresponding to a fifth exemplary design rule for an interconnect zone according to the invention. This rule specifies that data from first layout zone 303 may not properly: (1) overlap interconnect zone 309 (e.g., trace 1300A); (2) reside inside interconnect zone 309 (e.g., trace 1300B); or (3) reside inside second layout zone 306 (e.g., trace 1300C). Thus, none of traces 1300A–1300C meets the requirements of the rule.

Figure 14:
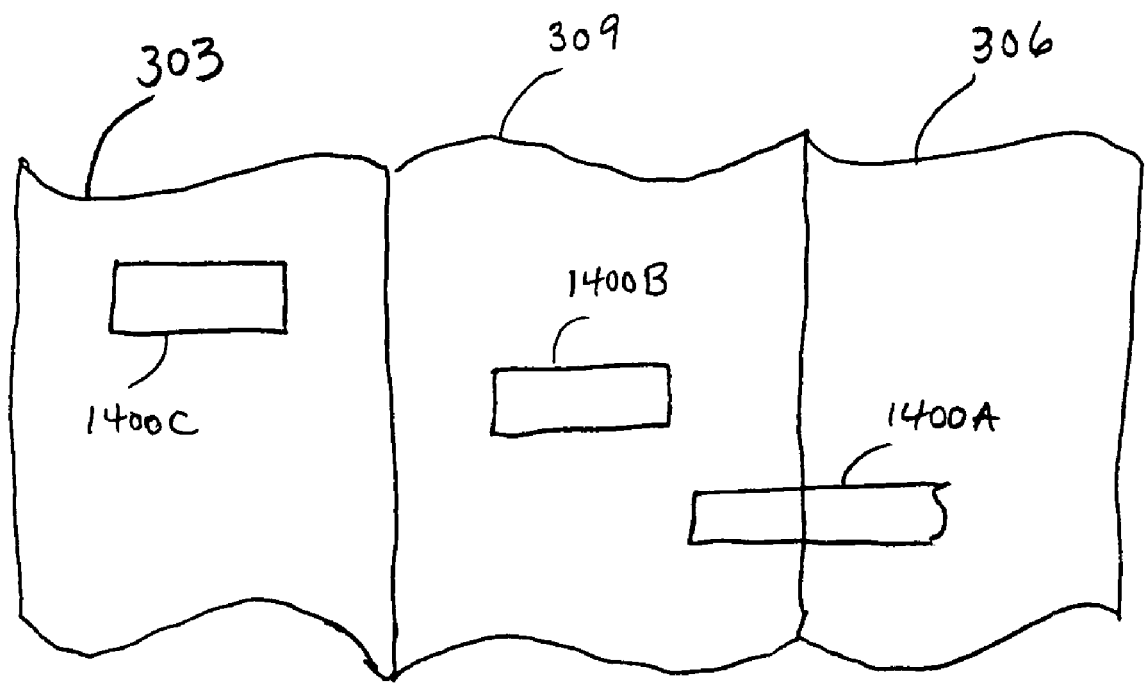
FIG. 14 illustrates a layout arrangement that corresponds to a sixth exemplary design rule for an interconnect zone according to the invention.

FIG. 14 shows a layout arrangement that corresponds to a sixth exemplary design rule for an interconnect zone according to the invention. This rule is similar to the previous rule, but governs data from second layout zone 306. The rule specifies that data from second layout zone 306 may not properly: (1) overlap interconnect zone 309 (e.g., trace 1400A); (2) reside inside interconnect zone 309 (e.g., trace 1400B); or (3) reside inside first layout zone 303 (e.g., trace 1400C). Thus, none of traces 1400A–1400C meets the requirements of the rule.

Figure 15:
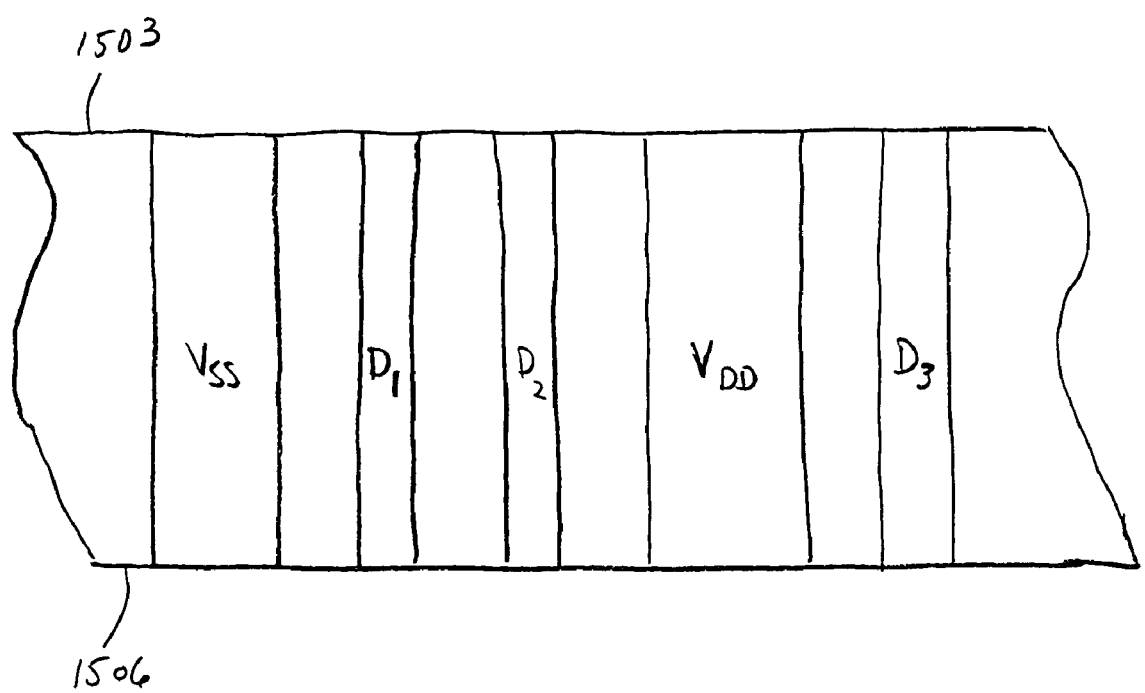
FIG. 15 depicts a layout arrangement corresponding to a seventh exemplary design rule for an interconnect zone according to the invention.

FIG. 15 shows a layout arrangement corresponding to a seventh exemplary design rule for an interconnect zone according to the invention. This rule specifies that each structure (e.g., a coupler) within an interconnect zone should touch both an upper boundary 1503 and a lower boundary 1506 of that interconnect zone. The rule may also specify other items, such as the minimum feature size for the interconnect zone, the shape (e.g., rectangular polygon) of items within the interconnect zone, and a descriptive label for each item that identifies its name and/or function. In the figure, the items $V_{SS}$, $D_1$, $D_2$, $V_{DD}$, and $D_3$ signify, respectively, ground, signal line $D_1$, signal line $D_2$, power, and signal line $D_3$.

Figure 16:
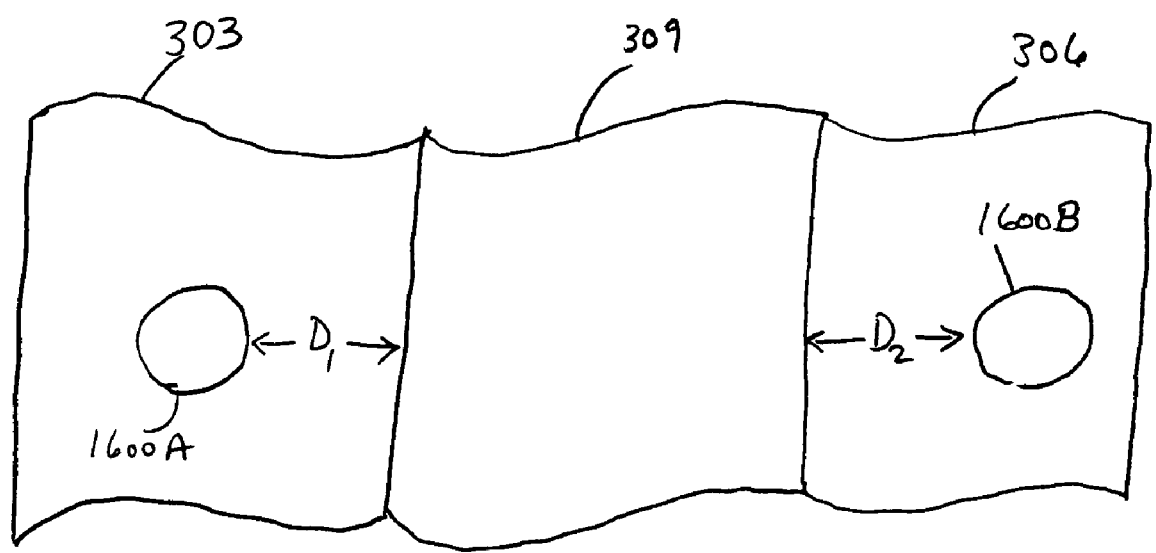
FIG. 16 shows a layout arrangement that corresponds to an eighth exemplary design rule for an interconnect zone according to the invention.

FIG. 16 shows a layout arrangement that corresponds to an eighth exemplary design rule for an interconnect zone according to the invention. The rule specifies distances of bump pads (used, for example, for solder bumps in a flip-chip arrangement) from interconnect zones. Referring to the figure, $D_1$ specifies the distance between bump pad 1600A in first layout zone 303 to interconnect zone 309. Similarly, $D_2$ specifies the distance between bump pad 1600B in second layout zone 306 to interconnect zone 309.

Figure 17:
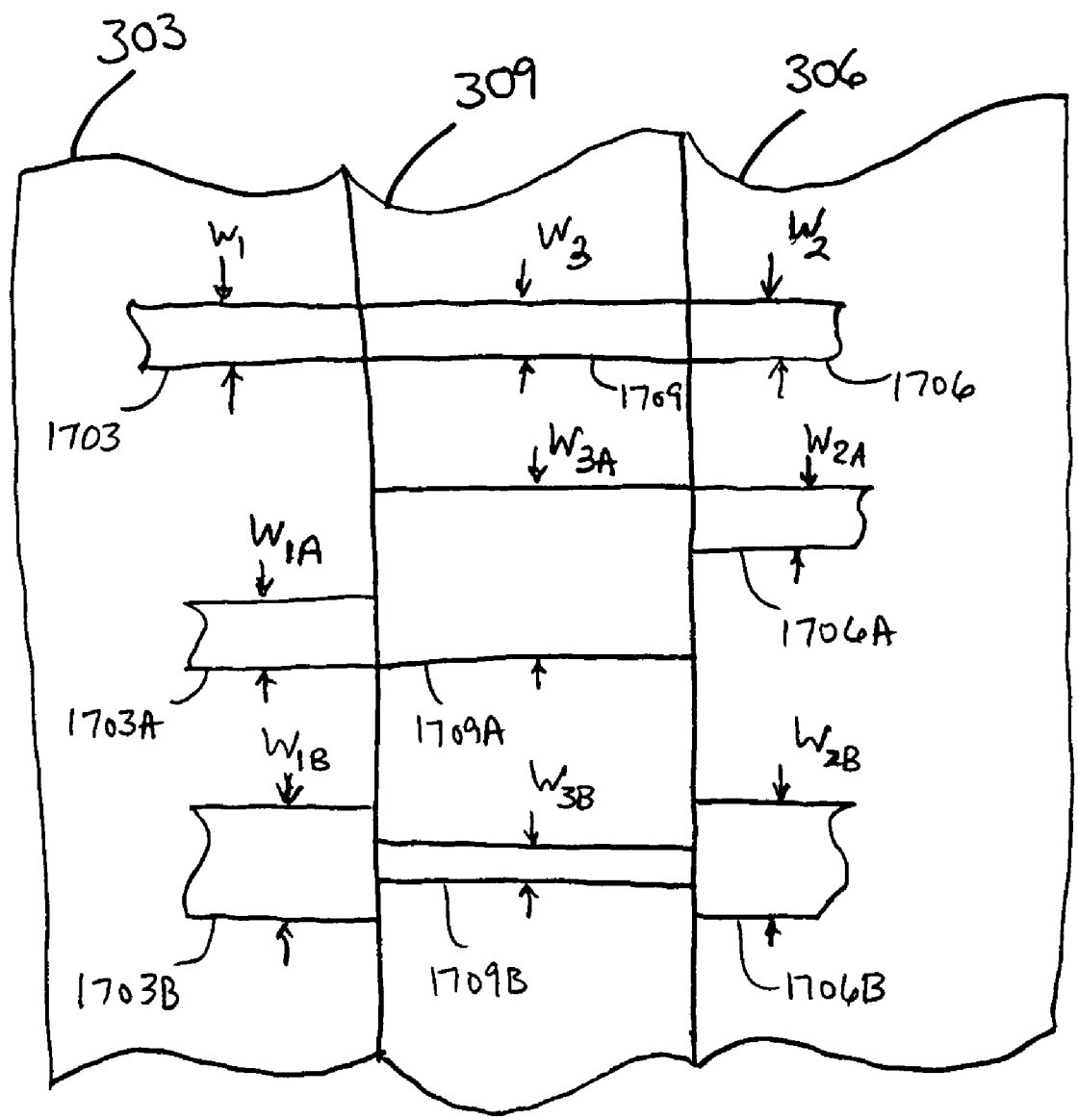
FIG. 17 illustrates a layout arrangement corresponding to a ninth exemplary design rule for an interconnect zone according to the invention.

FIG. 17 shows a layout arrangement corresponding to a ninth exemplary design rule for an interconnect zone according to the invention. The rule specifies that the width ($W_1$) of trace 1703 in first layout zone 303 should match the width ($W_2$) of trace 1706 in second layout zone 306, which in turn matches the width ($W_3$) of trace 1709 in interconnect zone 309. In other words, $$W_1 = W_2 = W_3.$$

Note that the widths of traces 1703A, 1706A, and 1709A ($W_{1A}$, $W_{2A}$, and $W_{3A}$, respectively) do not meet the rule's requirements, because $$W_{1A} < W_{3A}, \text{ and}$$

$$W_{2A} < W_{3A}.$$

Likewise, the widths of traces 1703B, 1706B, and 1709B ($W_{1B}$, $W_{2B}$, and $W_{3B}$, respectively) do not meet the rule's requirements, because $$W_{1B} > W_{3B}, \text{ and}$$

$$W_{2B} > W_{3B}.$$

As noted above, one may provide other design rules, as desired. One such rule may constitute the "antenna rule." The antenna rule specifies the maximum length of an uninterrupted trace within an IC in order to avoid accumulation of static charge during fabrication that may cause damage to gate dielectric material within transistors.

As persons skilled in the art with the benefit of the description of the invention understand, one may use fewer rules, different rules, and/or more rules than those described here. For example, one may include a rule or set of rules that specify acceptable shapes of the interconnect zone. As another example, one may use rules that modify, relax, or tighten the requirements of the rules described here. The choice of type, number, and specific requirements of design rules depends on various factors, such as the semiconductor technology, design methodology, and/or fabrication process used in a particular implementation, as persons of ordinary skill in the art understand.

As noted above, one may use interconnect zone cells in a variety of ICs, such as ICs that include PLD circuitry. In such an application, the first IC block may constitutes the PLD circuitry (e.g., programmable interconnects, pass devices or transistors, multiplexers, look-up table circuits, programmable logic circuitry, and/or logic gates or logic circuitry coupled to one another in a manner known to persons skilled in the art). The second IC block (and additional IC blocks, as desired) constitute other circuitry, as described above. For example, a second IC block may constitute a first processor, a third IC block may constitute a second processor, a microcontroller, or controller, and so on. Interconnect zone cells couple the first IC block to the other IC block(s). One may use such ICs in data-processing systems and circuitry. FIGS. 18–21 illustrate examples of data-processing systems that use such ICs (labeled as 15005 in the figures) that include PLD circuitry as one IC block, other circuitry as one or more IC blocks, and one or more interconnect zone cells, and have layouts and databases as described above (including data sets for one or more interconnect zones).

Figure 18:
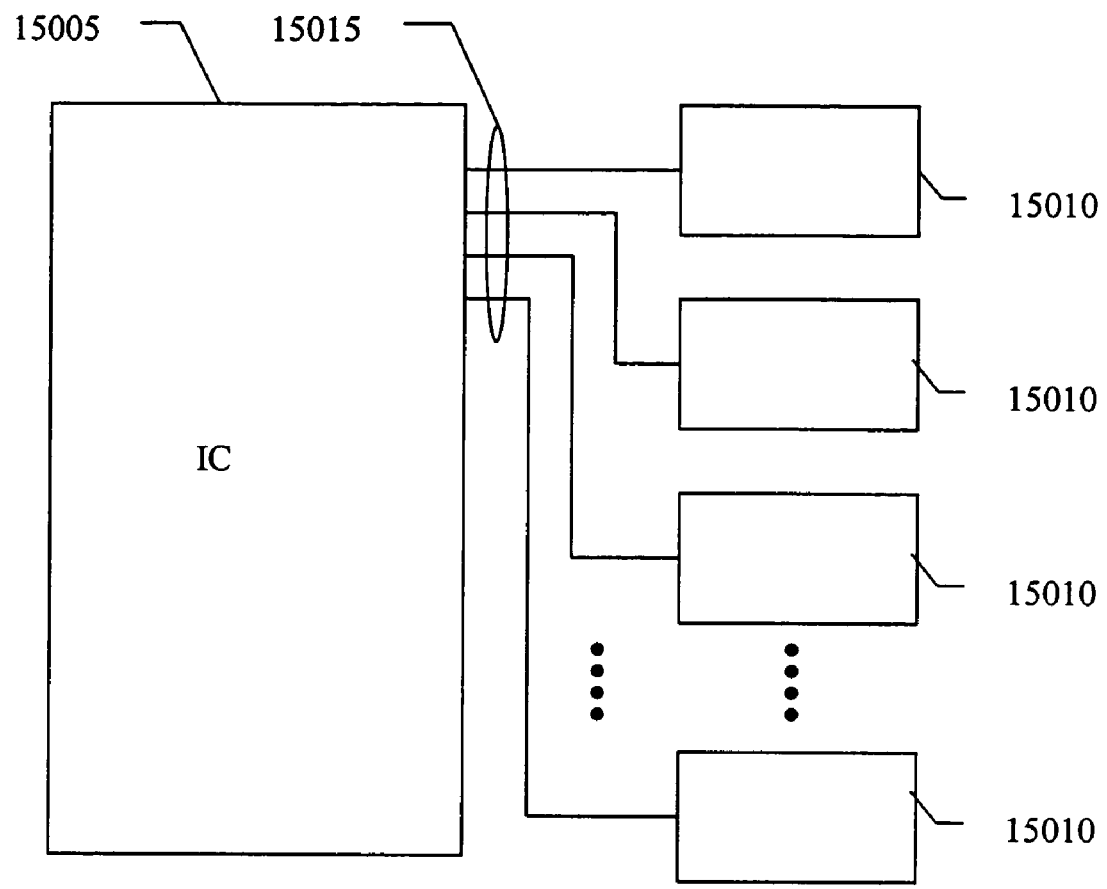
FIG. 18 depicts an embodiment of a data-processing system that includes an IC according to the invention.

FIG. 18 shows an embodiment 15000 of a data-processing system that includes an IC 15005 according to the invention. Embodiment 15000 also one or more peripherals 15010. Peripheral(s) 15010 couple to IC 15005 via signal links 15015. Signal links 15015 may constitute any suitable signal lines or a collection of a plurality of signal lines (i.e., a plurality of signal lines coupled to each of peripherals 15010, and the collection of the plurality of signal lines constituting signal links 15015).

Peripherals 15010 may include a variety of devices or circuits, as persons skilled in the art with the benefit of the disclosure of the invention recognize. For example, peripherals 15010 may include communication or telecommunication circuitry, video circuitry, audio circuitry, input circuitry, output circuitry, storage circuitry, memory circuitry, and network circuitry, as desired.

Figure 19:
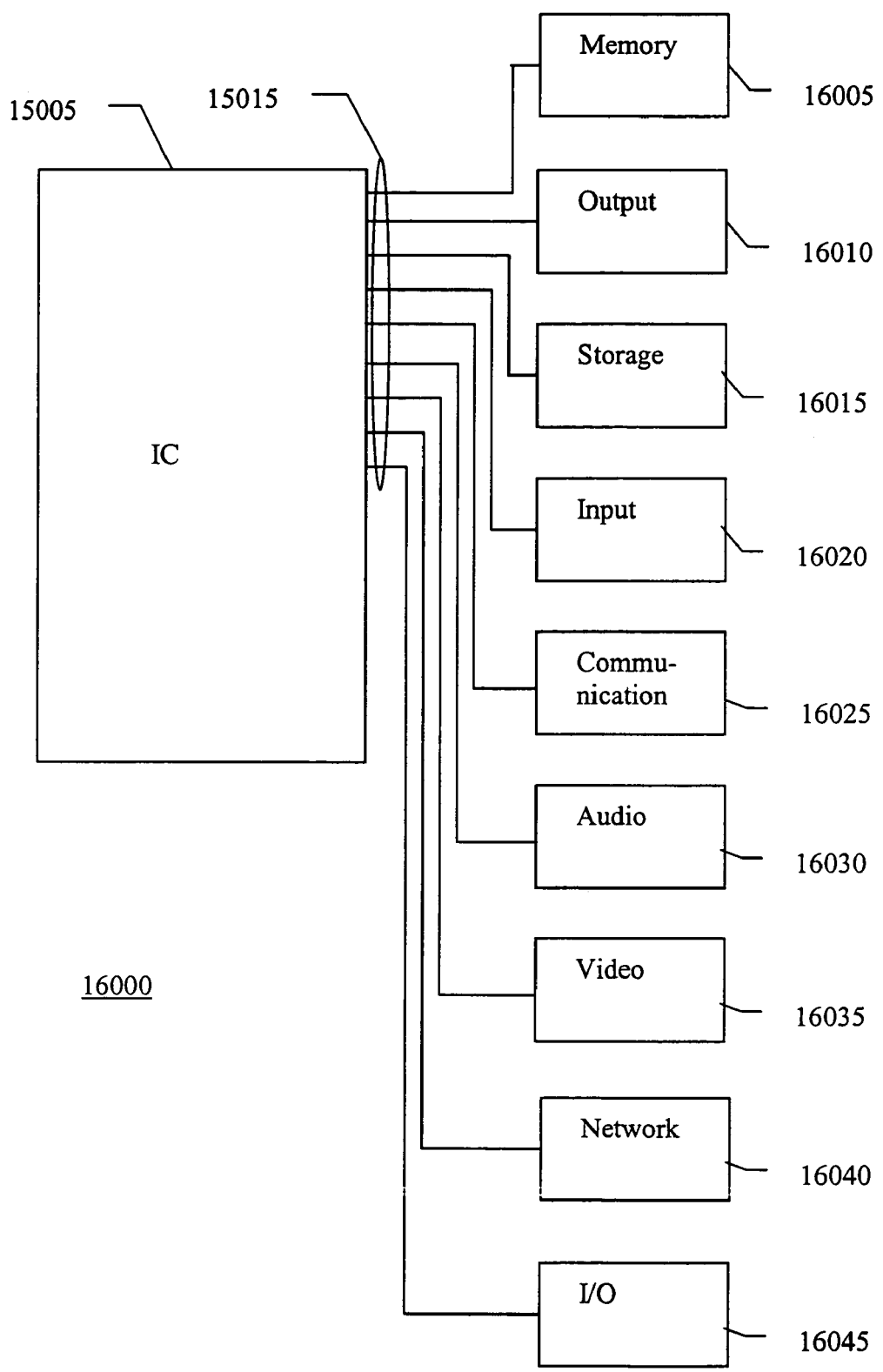
FIG. 19 shows another embodiment of a data-processing system that includes an IC according to the invention.

FIG. 19 shows another embodiment 16000 of a data-processing system that includes IC 15005 according to the invention. Embodiment 16000 includes a plurality of peripherals 16005–16045 that couple to IC 15005 via a plurality of signal links 15015. Signal links 15015 may constitute any suitable signal lines or a collection of a plurality of signal lines (i.e., a plurality of signal lines coupled to each of peripherals 16005–16045, and the collection of the plurality of signal lines constituting signal links 15015).

Peripherals 16005–16045 include one or more memory 16005 (e.g., SDRAM circuitry and associated controller), output circuitry 16010 (e.g., a printer), storage circuitry 16015 (e.g., a hard drive), input circuitry 16020 (e.g., a keyboard), communication circuitry 16025 (e.g., a modem), audio circuitry 16030 (e.g., sound card, speakers), video circuitry 16035 (e.g., a video controller, monitor, or both), network circuitry 16040 (e.g., an Ethernet controller or network interface card), and I/O circuitry 16045 (e.g., game controller or joystick). As persons skilled in the art recognize, however, one may use other peripheral devices and circuits, as desired. Furthermore, one may include more or fewer peripheral devices or circuits than shown, as desired.

Figure 20:
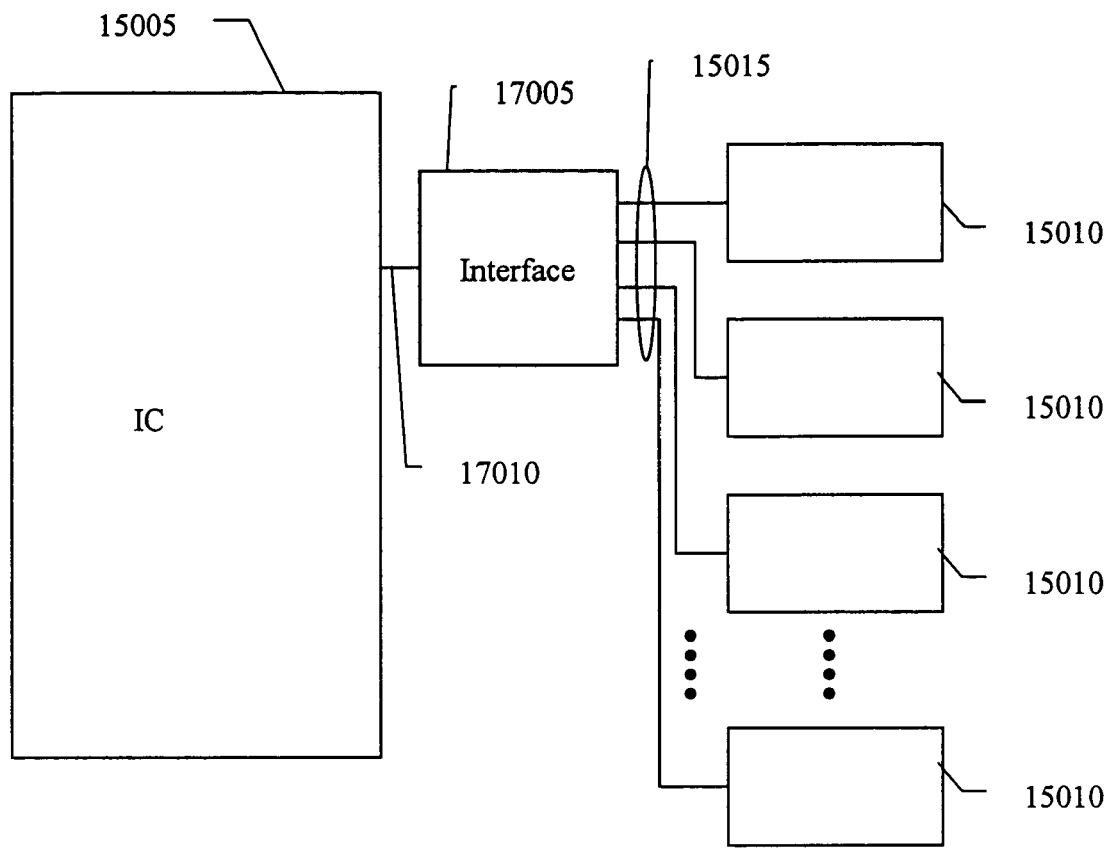
FIG. 20 illustrates an alternative embodiment of a data-processing system that includes an IC according to the invention.

FIG. 20 shows an alternative embodiment 17000 of a data-processing system that includes IC 15005 according to the invention. Embodiment 17000 also includes one or more peripherals 15010. Peripheral(s) 15010 couple to IC 15005 via interface circuit 17005. Peripherals 15010 may include a variety of devices or circuits, as persons skilled in the art recognize. For example, peripherals 15010 may include communication or telecommunication circuitry, video circuitry, audio circuitry, input circuitry, output circuitry, storage circuitry, memory circuitry, and network circuitry, as desired. Peripherals 15010 couple to interface circuit 17005 via signal links 15015. Signal links 15015 may constitute any suitable signal lines or a collection of a plurality of signal lines (i.e., a plurality of signal lines coupled to each of peripherals 15010, and the collection of the plurality of signal lines constituting signal links 15015).

Interface circuit 17005 couples to IC 15005 via a signal link 17010. Signal link 17010 may constitute any suitable line or link, for example, a bus or multiple buses (such as address and data buses), as desired. Furthermore, signal link 17010 may include one or more separate or specialized status, data, and/or control signals, as desired. Using signal links 15015 and 17010, the interface circuit 17005 communicates data signals, status signals, and/or control signals between IC 15005 and peripherals 15010. Interface circuit 17005 may also control the operation of peripherals 15010, either individually, or with the supervision of IC 15005, as desired.

Figure 21:
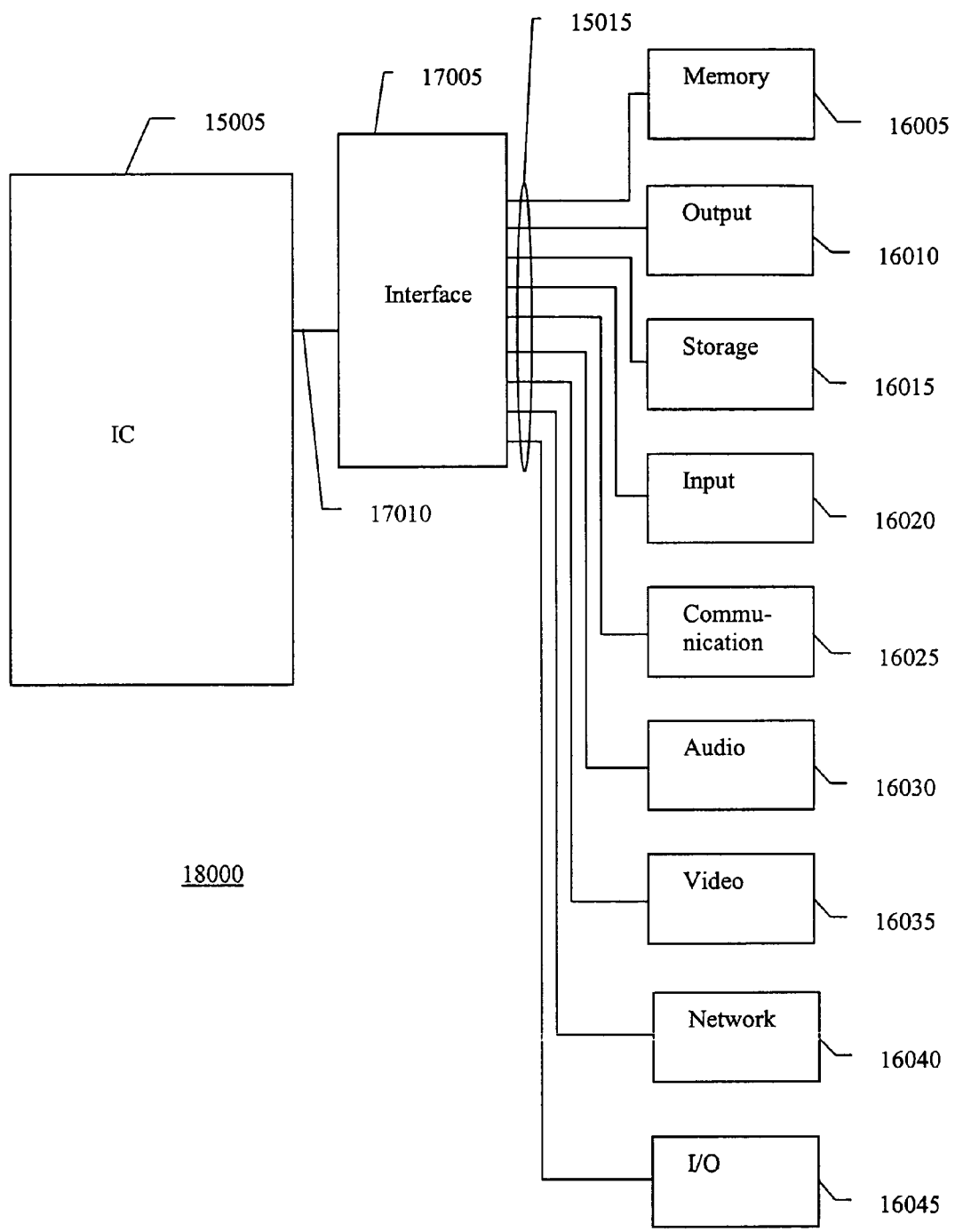
FIG. 21 depicts another alternative embodiment of a data-processing system that includes an IC according to the invention.

FIG. 21 illustrates another alternative embodiment 18000 of a data-processing system that includes IC 15005 according to the invention. Embodiment 18000 includes a plurality of peripherals 16005–16045. Peripherals 16005–16045 include one or more memory 16005 (e.g., SDRAM circuitry and associated controller), output circuitry 16010 (e.g., a printer), storage circuitry 16015 (e.g., a hard drive), input circuitry 16020 (e.g., a keyboard), communication circuitry 16025 (e.g., a modem), audio circuitry 16030 (e.g., sound card, speakers), video circuitry 16035 (e.g., a video controller, monitor, or both), network circuitry 16040 (e.g., an Ethernet controller or network interface card), and I/O circuitry 16045 (e.g., game controller or joystick). As persons skilled in the art will recognize, however, one may use other peripheral devices and circuits, as desired. Furthermore, one may include more or fewer peripheral devices or circuits than shown, as desired.

Similar to embodiment 17000, peripherals 16005–16045 in embodiment 18000 couple to interface circuit 17005 via signal links 15015. Signal links 15015 may constitute any suitable signal lines or a collection of a plurality of signal lines (i.e., a plurality of signal lines coupled to each of peripherals 16005–16045, and the collection of the plurality of signal lines constituting signal links 15015).

Interface circuit 17005 couples to IC 15005 via a signal link 17010. Signal link 17010 may constitute any suitable line or link, for example, a bus or multiple buses (such as address and data buses), as desired. Furthermore, signal link 17010 may include one or more separate or specialized status, data, and/or control signals, as desired. Using signal links 15015 and 17010, interface circuit 17005 communicates data signals, status signals, and/or control signals between IC 15005 and peripherals 16005–16045. Interface circuit 17005 may also control the operation of peripherals 16005–16045, either individually, or with the supervision of IC 15005, as desired.

Referring to FIGS. 18 and 20, IC 15005 (and/or one or more of peripherals 15010) may also include one or more processors (including microprocessors and microcontrollers), as desired. The processor or processors may couple (not shown explicitly) to various parts of IC 15005 and/or peripherals 15015. The processor or processors may operate on the data within the data-processing systems and decode and execute instructions. The processor or processors may couple to and/or communicate with peripherals 15010, as desired. Note that more than one of peripherals 15010 may couple to and/or communicate with a given processor, as desired. Note further that more than one processor may couple to and/or communicate with a given one of peripherals 15010, as desired.

Similarly, referring to FIGS. 19 and 21, IC 15005 (and/or one or more of peripherals 16005–16045) may also include one or more processors, as desired. The processor or processors may couple (not shown explicitly) to various parts of IC 15005 and/or peripherals 16005–16045. The processor or processors may operate on the data within the data-processing systems and decode and execute instructions. The processor or processors may couple to and/or communicate with peripherals 16005–16045, as desired. Note that more than one of peripherals 16005–16045 may couple to and/or communicate with a given processor, as desired. Note further that more than one processor may couple to and/or communicate with a given one of peripherals 16005–16045, as desired.

Referring to the figures, the various blocks shown may depict mainly the conceptual functions and signal flow. The actual circuit implementation may or may not contain separately identifiable hardware for the various functional blocks. For example, one may combine the functionality of various blocks into one circuit block, as desired. Furthermore, one may realize the functionality of a single block in several circuit blocks, as desired. The choice of circuit implementation depends on various factors, such as particular design and performance specifications for a given implementation, as persons of ordinary skill in the art who have read the disclosure of the invention will understand.

Other modifications and alternative embodiments of the invention in addition to those described here will be apparent to persons of ordinary skill in the art who have the benefit of the description of the invention. Accordingly, this description teaches those skilled in the art the manner of carrying out the invention and are to be construed as illustrative only.

The forms of the invention shown and described should be taken as the presently preferred embodiments. Persons skilled in the art may make various changes in the shape, size and arrangement of parts without departing from the scope of the invention described in this document. For example, persons skilled in the art may substitute equivalent elements for the elements illustrated and described here. Moreover, persons skilled in the art who have the benefit of this description of the invention may use certain features of the invention independently of the use of other features, without departing from the scope of the invention.

We claim:

1. An interconnect zone cell adapted to reside within an integrated circuit, the interconnect zone cell surrounding a first circuit block within the integrated circuit and being surrounded by a second circuit block within the integrated circuit comprising a coupler that connects to a portion of the first circuit block and that connects to a portion of a second circuit block and establishes a physical communication path within the integrated circuit between the first circuit block and the second circuit block, wherein the first circuit block is manufactured on the integrated circuit according to a first minimum feature size, and the second circuit block is manufactured on the integrated circuit according to a second minimum feature size, and wherein the first minimum feature size is different than the second minimum feature size.

2. The interconnect zone cell according to claim 1, wherein the coupler comprises at least one of a metal pin, a via, and a diffusion region.

3. The interconnect zone cell according to claim 2, wherein the coupler is made of at least one of metal, polysilicon, and doped semiconductor.

4. The interconnect zone cell according to claim 3, wherein the coupler is fabricated in a complementary metal oxide semiconductor process.

5. An integrated circuit, comprising:
    a first circuit block within the integrated circuit, the first circuit block manufactured on the integrated circuit according to a first minimum feature size;
    a second circuit block within the integrated circuit, the second circuit block manufactured on the integrated circuit according to a second minimum feature size, wherein the second minimum feature size is different than the first minimum feature size; and
    an interconnect zone cell surrounding the first circuit block and being surrounded by the second circuit block configured to connect to a portion of the first circuit block and to connect to a portion of the second circuit block, wherein the interconnect zone cell establishes a physical communication path within the integrated circuit between the first circuit block and the second circuit block.

6. The integrated circuit according to claim 5, wherein the interconnect zone cell comprises a coupler configured to connect to the portion of the first circuit block and to connect to the portion of the second circuit block and to establish the physical communication path between the first circuit block and the second circuit block.

7. The integrated circuit according to claim 6, wherein the coupler comprises at least one of a metal pin, a via, and a diffusion region.

8. The interconnect zone cell according to claim 7, wherein the coupler is made of at least one of metal, polysilicon, and doped semiconductor.

9. The integrated circuit according to claim 8, wherein the first circuit block comprises programmable logic device circuitry.

10. The integrated circuit according to claim 9, wherein the second circuit block comprises at least one of a processor, a microprocessor, a controller, a microcontroller, an intellectual property block, and a memory.

11. The integrated circuit according to claim 10, wherein the coupler is fabricated in a complementary metal oxide semiconductor process.

12. The integrated circuit according to claim 11, wherein the first circuit block is fabricated in the complementary metal oxide semiconductor process.

13. The integrated circuit according to claim 12, wherein the second circuit block is fabricated in the complementary metal oxide semiconductor process.

14. The integrated circuit according to claim 13, used in a data-processing system.

15. The integrated circuit according to claim 13, used in a data-processing system that includes at least one peripheral.

16. The integrated circuit according to claim 13, used in a data-processing system that includes at least one peripheral coupled to an interface circuit.

17. A layout for an integrated circuit, comprising:
    a first layout zone, including a layout for a first circuit block within the integrated circuit, the first layout zone manufactured on the integrated circuit according to a first minimum feature size;
    a second layout zone, including a layout for a second circuit block within the integrated circuit, the second layout zone manufactured on the integrated circuit according to a second minimum feature size, wherein the second minimum feature size is different than the first minimum feature size; and
    an interconnect zone manufactured on the integrated circuit adjacent to the first layout zone and the second layout zone configured to establish a physical communication path within the integrated circuit between the first layout zone and the second layout zone, wherein the interconnect zone surrounds the first layout zone, and wherein the second layout zone surrounds the interconnect zone.

18. The layout according to claim 17, wherein the interconnect zone comprises a layout for a coupler configured to connect to a portion of the first circuit block and to connect to a portion of the second circuit block.

19. The layout according to claim 18, wherein the interconnect zone comprises a layout for at least one of a metal region, a polysilicon region, and a diffusion region.

20. The layout according to claim 19, wherein the first layout zone comprises a layout for programmable logic device circuitry.

21. The layout according to claim 20, wherein the second layout zone comprises a layout for at least one of a processor, a microprocessor, a controller, a microcontroller, an intellectual property block, and a memory.

22. The layout according to claim 21, wherein the interconnect zone abuts the first layout zone on a first side of the interconnect zone, and wherein the interconnect zone abuts the second layout zone on a second side of the interconnect zone.

23. The layout according to claim 22, wherein the coupler is configured for a complementary metal oxide semiconductor process.

24. The layout according to claim 23, wherein the first and second circuit blocks are configured for the complementary metal oxide semiconductor process.

25. The layout according to claim 24, wherein the interconnect zone is manufactured on the integrated circuit according to a set of design rules.

26. The layout according to claim 21, wherein the coupler is configured for a complementary metal oxide semiconductor process.

27. The layout according to claim 26, wherein the first and second circuit blocks are configured for the complementary metal oxide semiconductor process.

28. The layout according to claim 27, wherein the interconnect zone is manufactured on the integrated circuit according to a set of design rules.

29. The layout according to claim 18, wherein the second layout zone includes a rescaled layout for the second circuit block.

30. A method of producing a layout for an integrated circuit, comprising:
generating a first layout zone manufactured on the integrated circuit according to a first minimum feature size, the first layout zone including a layout for a first circuit block within the integrated circuit;
generating a second layout zone manufactured on the integrated circuit according to a second minimum feature size, the second layout zone including a layout for a second circuit block within the integrated circuit, wherein the second minimum feature size is different than the first minimum feature size; and
establishing a physical communication path within the integrated circuit between the first layout zone and the second layout zone by using an interconnect zone wherein the interconnect zone surrounds the first layout zone, and wherein the second layout zone surrounds the interconnect zone.

31. The method according to claim 30, wherein establishing a physical communication path between the first layout zone and the second layout zone comprises including within the interconnect zone a layout for a coupler configured to connect to a portion of the first circuit block and to connect to a portion of the second circuit block.

32. The method according to claim 31, wherein including within the interconnect zone a layout for a coupler comprises including a layout for at least one of a metal region, a polysilicon region, and a diffusion region.

33. The method according to claim 32, wherein the second layout zone comprises a rescaled layout for the second circuit block.

34. The method according to claim 32, wherein generating the first layout zone comprises generating a layout for programmable logic device circuitry.

35. The method according to claim 34, wherein generating the second layout zone comprises generating a layout for at least one of a processor, a microprocessor, a controller, a microcontroller, an intellectual property block, and a memory.

36. The method according to claim 35, wherein joining the first layout zone to the second layout zone comprises using an interconnect zone that is manufactured on the integrated circuit so as to abut the first layout zone on a first side of the interconnect zone and to abut the second layout zone on a second side of the interconnect zone.

37. The method according to claim 36, wherein including within the interconnect zone a layout for a coupler comprises including a layout for a coupler that is configured for a complementary metal oxide semiconductor process.

38. The method according to claim 37, wherein generating the first layout zone comprises generating a layout for a first circuit block that is configured for the complementary metal oxide semiconductor process, and wherein generating the second layout zone comprises generating a layout for a second circuit block that is configured for the complementary metal oxide semiconductor process.

39. The method according to claim 38, wherein using the interconnect zone comprises using an interconnect zone manufactured on the integrated circuit according to a set of design rules.

40. The method according to claim 35, wherein including within the interconnect zone a layout for a coupler comprises including a layout for a coupler that is configured for a complementary metal oxide semiconductor process.

41. The method according to claim 40, wherein generating the first layout zone comprises generating a layout for a first circuit block that is configured for the complementary metal oxide semiconductor process, and wherein generating the second layout zone comprises generating a layout for a second circuit block that is configured for the complementary metal oxide semiconductor process.

42. The method according to claim 41, wherein using the interconnect zone comprises using an interconnect zone manufactured on the integrated circuit according to a set of design rules.

43. A method of generating a layout database for an integrated circuit, comprising:
generating a first layout database, the first layout database including a first data set for a first circuit adapted to be manufactured on the integrated circuit according to a first minimum feature size;
generating a second layout database, the second layout database including a second data set for a second circuit adapted to be manufactured on the integrated circuit according to a second minimum feature size, wherein the second minimum feature size is different than the first minimum feature size; and
combining the first and second databases to generate the layout database for the integrated circuit, wherein the first and second circuits in the combined layout database are adapted to be manufactured on the integrated circuit according to a third and a fourth minimum feature sizes, wherein the third minimum feature size is different than the fourth minimum feature size, and wherein the combined layout database includes a data set for establishing a physical communication path between the first and second circuits.

44. The method according to claim 43, wherein generating the first layout database further comprises including within the first layout database a data set for an interconnect zone configured to facilitate combining the first and second layout databases.

45. The method according to claim 44, wherein generating the second layout database further comprises including within the second layout database the data set for the interconnect zone.

46. The method according to claim 45, wherein including the data set for the interconnect zone within the first and second layout databases comprises including the data set for an interconnect zone cell, the interconnect zone cell comprising a coupler configured to connect to a portion of the first circuit and to connect to a portion of the second circuit and to establish the physical communication path within the integrated circuit between the first circuit and the second circuit.

47. The method according to claim 46, further comprising rescaling one of the first and second data sets before combining the first and second layout databases.

48. The method according to claim 47, further comprising verifying the first layout database before combining the first and second databases.

49. The method according to claim 48, wherein verifying the first layout database comprises performing a design rule check (DRC) of the first layout database.

50. The method according to claim 49, wherein verifying the first layout database further comprises performing layout versus schematic (LVS) verification of the first layout database.

51. The method according to claim 50, further comprising verifying the second layout database before combining the first and second databases.

52. The method according to claim 51, wherein verifying the second layout database comprises performing a design rule check (DRC) of the second layout database.

53. The method according to claim 52, wherein verifying the second layout database further comprises performing layout versus schematic (LVS) verification of the second layout database.

54. The method according to claim 53, wherein the data set for the interconnect zone comprises data for at least one of a metal region, a polysilicon region, and a diffusion region used in the coupler.

55. The method according to claim 54, wherein the first circuit comprises programmable logic device circuitry.

56. The method according to claim 55, wherein the second circuit comprises a processor, a microprocessor, a controller, a microcontroller, an intellectual property block, or a memory.

57. The method according to claim 56, wherein the data set for the interconnect zone comprises data for a GDS2 layer corresponding to the interconnect zone.

58. The method according to claim 57, wherein the interconnect zone is manufactured on the integrated circuit according to a set of design rules.

59. The method according to claim 58, wherein the data set for the interconnect zone corresponds to an interconnect zone that is manufactured on the integrated circuit so as to abut a layout for the first circuit on a first side of the interconnect zone and to abut a layout for the second circuit on a second side of the interconnect zone.

60. The method according to claim 59, wherein the integrated circuit is configured for a complementary metal oxide semiconductor process.

61. The method according to claim 58, wherein the data set for the interconnect zone corresponds to an interconnect zone having a layout that surrounds the layout for the first circuit and is surrounded by the layout for the second circuit.

62. The method according to claim 61, wherein the integrated circuit is configured for a complementary metal oxide semiconductor process.

\* \* \* \* \*